(12) United States Patent
Horiuchi

(10) Patent No.: US 9,711,282 B2
(45) Date of Patent: Jul. 18, 2017

(54) POWER RECEPTION DEVICE, POWER TRANSMISSION DEVICE, AND POWER TRANSFER SYSTEM

(75) Inventor: Satoru Horiuchi, Toyota (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 596 days.

(21) Appl. No.: 14/345,063

(22) PCT Filed: Sep. 28, 2011

(86) PCT No.: PCT/JP2011/072229
§ 371 (c)(1),
(2), (4) Date: Mar. 14, 2014

(87) PCT Pub. No.: WO2013/046368
PCT Pub. Date: Apr. 4, 2013

(65) Prior Publication Data
US 2014/0354068 A1 Dec. 4, 2014

(51) Int. Cl.
*H02J 17/00* (2006.01)
*H02J 5/00* (2016.01)
(Continued)

(52) U.S. Cl.
CPC .............. *H01G 2/02* (2013.01); *B60L 11/123* (2013.01); *B60L 11/14* (2013.01); *B60L 11/182* (2013.01); *B60L 11/1811* (2013.01); *B60L 11/1824* (2013.01); *B60L 11/1833* (2013.01); *H01F 27/36* (2013.01); *H01F 38/14* (2013.01); *H02J 7/025* (2013.01); *H05K 5/03* (2013.01); *H05K 9/0007* (2013.01); *B60L 2210/10* (2013.01); *B60L 2210/30* (2013.01); *B60L 2210/40* (2013.01); *B60L 2270/145* (2013.01);
(Continued)

(58) Field of Classification Search
CPC .. H02J 17/00; H02J 5/005; H02J 7/025; H02J 3/01; H01F 38/14; B60L 11/182; B60L 11/1829; B60L 11/1831; Y02T 90/122; H04B 5/0037
See application file for complete search history.

(56) References Cited

U.S. PATENT DOCUMENTS 7,741,734 B2 6/2010 Joannopoulos et al.
2007/0222542 A1 9/2007 Joannopoulos et al.
(Continued)

FOREIGN PATENT DOCUMENTS

AU 2006269374 B2 1/2007
AU 2006269374 C1 1/2007
(Continued)

*Primary Examiner* — Jared Fureman
*Assistant Examiner* — Rafael Pacheco
(74) *Attorney, Agent, or Firm* — Oliff PLC

(57) ABSTRACT

A power reception device includes a power reception unit having a first capacitor, receiving electric power in a non-contact manner from an externally provided power transmission unit, a first housing case housing the power reception unit inside, and a first anchor member anchoring the first capacitor. The first housing case includes a first shield defining a region where an electromagnetic field developed around the power reception unit is emitted. The first capacitor is anchored by the first anchor member at a position spaced apart from the first shield.

24 Claims, 17 Drawing Sheets

(51) Int. Cl.
*H01G 2/02* (2006.01)
*B60L 11/12* (2006.01)
*B60L 11/14* (2006.01)
*B60L 11/18* (2006.01)
*H01F 27/36* (2006.01)
*H01F 38/14* (2006.01)
*H02J 7/02* (2016.01)
*H05K 5/03* (2006.01)
*H05K 9/00* (2006.01)

(52) U.S. Cl.
CPC ..... *H01F 2038/146* (2013.01); *Y02T 10/6217* (2013.01); *Y02T 10/7005* (2013.01); *Y02T 10/7022* (2013.01); *Y02T 10/7072* (2013.01); *Y02T 10/7077* (2013.01); *Y02T 10/7216* (2013.01); *Y02T 10/7241* (2013.01); *Y02T 90/12* (2013.01); *Y02T 90/121* (2013.01); *Y02T 90/122* (2013.01); *Y02T 90/125* (2013.01); *Y02T 90/127* (2013.01); *Y02T 90/14* (2013.01)

(56) References Cited

U.S. PATENT DOCUMENTS

| | | |
|---|---|---|
| 2008/0278264 A1 | 11/2008 | Karalis et al. |
| 2009/0195332 A1 | 8/2009 | Joannopoulos et al. |
| 2009/0195333 A1 | 8/2009 | Joannopoulos et al. |
| 2009/0224856 A1 | 9/2009 | Karalis et al. |
| 2009/0267709 A1 | 10/2009 | Joannopoulos et al. |
| 2009/0267710 A1 | 10/2009 | Joannopoulos et al. |
| 2010/0096934 A1 | 4/2010 | Joannopoulos et al. |
| 2010/0102639 A1 | 4/2010 | Joannopoulos et al. |
| 2010/0102640 A1 | 4/2010 | Joannopoulos et al. |
| 2010/0102641 A1 | 4/2010 | Joannopoulos et al. |
| 2010/0117455 A1 | 5/2010 | Joannopoulos et al. |
| 2010/0117456 A1 | 5/2010 | Karalis et al. |
| 2010/0123353 A1 | 5/2010 | Joannopoulos et al. |
| 2010/0123354 A1 | 5/2010 | Joannopoulos et al. |
| 2010/0123355 A1 | 5/2010 | Joannopoulos et al. |
| 2010/0127573 A1 | 5/2010 | Joannopoulos et al. |
| 2010/0127574 A1 | 5/2010 | Joannopoulos et al. |
| 2010/0127575 A1 | 5/2010 | Joannopoulos et al. |
| 2010/0133918 A1 | 6/2010 | Joannopoulos et al. |
| 2010/0133919 A1 | 6/2010 | Joannopoulos et al. |
| 2010/0133920 A1 | 6/2010 | Joannopoulos et al. |
| 2010/0171370 A1 | 7/2010 | Karalis et al. |
| 2010/0181844 A1 | 7/2010 | Karalis et al. |
| 2010/0187911 A1 | 7/2010 | Joannopoulos et al. |
| 2010/0201205 A1 | 8/2010 | Karalis et al. |
| 2010/0207458 A1 | 8/2010 | Joannopoulos et al. |
| 2010/0225175 A1 | 9/2010 | Karalis et al. |
| 2010/0231053 A1 | 9/2010 | Karalis et al. |
| 2010/0237706 A1 | 9/2010 | Karalis et al. |
| 2010/0237707 A1 | 9/2010 | Karalis et al. |
| 2010/0237708 A1 | 9/2010 | Karalis et al. |
| 2010/0253152 A1 | 10/2010 | Karalis et al. |
| 2010/0264745 A1 | 10/2010 | Karalis et al. |
| 2011/0198938 A1* | 8/2011 | Park ................ H02J 17/00 307/104 |
| 2011/0254378 A1 | 10/2011 | Ichikawa et al. |

FOREIGN PATENT DOCUMENTS

| | | |
|---|---|---|
| AU | 2007349874 A2 | 10/2008 |
| AU | 2010200044 A1 | 1/2010 |
| CA | 2 615 123 A1 | 1/2007 |
| CA | 2 682 284 A1 | 10/2008 |
| CN | 101258658 A | 9/2008 |
| CN | 101682216 A | 3/2010 |
| CN | 101860089 A | 10/2010 |
| CN | 102177042 A | 9/2011 |
| DE | 102008033205 A1 | 1/2010 |
| EP | 1 902 505 A2 | 3/2008 |
| EP | 2 130 287 A1 | 12/2009 |
| EP | 2345553 A1 | 7/2011 |
| IN | 735/DELNP/2008 | 5/2008 |
| IN | 6195/DELNP/2009 | 7/2010 |
| JP | H09-260181 A | 10/1997 |
| JP | H10-22159 A | 1/1998 |
| JP | H10-208984 A | 8/1998 |
| JP | A-2009-501510 | 1/2009 |
| JP | 2010-268660 | 11/2010 |
| JP | 2011-135729 A | 7/2011 |
| KR | 2008-0031398 A | 4/2008 |
| KR | 2010-0015954 A | 2/2010 |
| WO | WO 2007/008646 A2 | 1/2007 |
| WO | WO 2008/118178 A1 | 10/2008 |
| WO | WO 2010/041321 A1 | 4/2010 |

* cited by examiner

POWER RECEPTION DEVICE, POWER TRANSMISSION DEVICE, AND POWER TRANSFER SYSTEM

TECHNICAL FIELD

The present invention relates to a power reception device, a power transmission device, and a power transfer system.

BACKGROUND ART

In recent years, hybrid vehicles and electric vehicles having the driving wheel driven using electric power from a battery or the like are attracting attention from the standpoint of environmental issues.

Particularly in these few years, attention is focused on wireless charging that allows a battery to be charged in a non-contact manner without using a plug for an electric powered vehicle mounted with the aforementioned battery. Various schemes of the non-contact charging method are now proposed. Particularly, the technique to transfer electric power in a non-contact manner using a resonance phenomenon is attracting attention.

For example, WO2010/041321 discloses a non-contact electric power transmission device utilizing a resonance phenomenon. This non-contact electric power transmission device includes a shield member, a coil arranged in the shield member, and a capacitor connected to the coil.

Further, Japanese Patent Laying-Open No. 2010-268660 discloses a non-contact electric power transmission device utilizing a resonance phenomenon. This non-contact electric power transmission device includes a shield, a coil arranged in the shield, and a capacitor connected to the coil.

CITATION LIST

Patent Document

PTD 1: WO2010/041321
PTD 2: Japanese Patent Laying-Open No. 2010-268660

SUMMARY OF INVENTION

Technical Problem

The non-contact electric power transmission device disclosed in the aforementioned documents are absent of an anchor member that anchors the position of the capacitor. Therefore, when external force is exerted to the non-contact electric power transmission device or when the non-contact electric power transmission device is inclined, there is a possibility of the capacitor being shifted such that the distance between the capacitor and the shield becomes shorter than the distance of insulation.

In view of the foregoing, an object of the present invention is to provide a power transmission device, a power reception device, and a power transfer system having a capacitor anchored and having the capacitor and shield arranged with a distance therebetween.

Solution to Problem

A power transmission device according to the present invention includes a power reception unit having a first capacitor, receiving electric power in a non-contact manner from an externally provided power transmission unit, a first housing case housing the power reception unit inside, and a first anchor member anchoring the first capacitor. The first housing case includes a first shield defining a region where an electromagnetic field developed around the power reception unit is emitted. The first capacitor is anchored by the first anchor member at a position spaced apart from the first shield.

Preferably, the first shield includes a top plate, and a first peripheral wall formed suspending from the top plate. The first shield has a first opening formed, opposite to the top plate. The first housing case includes an insulative first lid closing the first opening. The first capacitor is anchored to the first lid.

Preferably, the first capacitor includes a first electrode, and a second electrode arranged opposite to the first electrode with a distance therebetween. The distance between the first capacitor and first shield is greater than the distance between the first electrode and the second electrode.

Preferably, the power reception unit includes a first wiring connected to the first capacitor, and a first coil connected to the first capacitor by the first wiring. The distance between the first shield and the first capacitor is greater than the distance between the first coil and the first capacitor.

Preferably, the power transmission device further includes a first device arranged in the first housing case, and provided spaced apart from the first capacitor. The distance between the first shield and the first capacitor is greater than the distance between the first device and the first capacitor.

Preferably, the first capacitor includes a first electrode, and a second electrode arranged opposite to the first electrode with a distance therebetween. The first anchor member includes a first contact face in contact with the first capacitor. A region of the first contact face, located between the first electrode and the second electrode, has a trench formed.

Preferably, the first shield includes a top plate, and a first peripheral wall formed suspending from the top plate. The first shield has a first opening formed, opposite to the top plate. The first housing case includes an insulative first lid closing the first opening, and a first support provided at the first lid, and supporting the first capacitor. The first capacitor includes a first electrode and a second electrode arranged opposite to the first electrode with a distance therebetween. A region of an inner circumferential face of the first support, located between the first electrode and the second electrode, has a trench formed.

Preferably, the first capacitor includes a first electrode and a second electrode arranged opposite to the first electrode with a distance therebetween. The first anchor member includes a first holder formed so as to cover a circumferential face of the first capacitor. A region of an inner circumferential face of the first holder, located between the first electrode and the second electrode, has a trench formed.

Preferably, the first capacitor includes a first electrode, and a second electrode arranged opposite to the first electrode with a distance therebetween. The first anchor member includes a second holder formed so as to cover a circumferential face of the first capacitor. A region of an inner circumferential face of the second holder, located between the first electrode and the second electrode, has a hole formed.

Preferably, the difference between the natural frequency of the power transmission unit and the natural frequency of the power reception unit is less than or equal to 10% the natural frequency of the power reception unit.

Preferably, the coupling coefficient of the power reception unit and the power transmission unit is less than or equal to 0.1.

Preferably, the power reception unit receives electric power from the power transmission unit through at least one of a magnetic field developed between the power reception unit and the power transmission unit, and oscillating at a particular frequency, and an electric field developed between the power reception unit and the power transmission unit, and oscillating at a particular frequency.

A power transmission device according to the present invention includes a power transmission unit having a second capacitor, transmitting electric power in a non-contact manner to an externally provided power reception unit, a second housing case housing the power transmission unit inside, and a second anchor member anchoring the second capacitor. The second housing case includes a second shield defining a region where an electromagnetic field developed around the power transmission unit is emitted. The second capacitor is anchored by the second anchor member at a position spaced apart from the second shield.

Preferably, the second shield includes a bottom plate, and a second peripheral wall formed erecting from the bottom plate. The second shield has a second opening formed, opposite to the bottom plate. The second housing case includes an insulative second lid closing the second opening. The second capacitor is anchored to the second lid.

Preferably, the second capacitor includes a third electrode, and a fourth electrode arranged opposite to the third electrode with a distance therebetween. The distance between the second capacitor and the second shield is greater than the distance between the third electrode and the fourth electrode.

Preferably, the power transmission unit includes a second wiring connected to the second capacitor, and a second coil connected to the second capacitor by the second wiring. The distance between the second shield and the second capacitor is greater than the distance between the second coil and the second capacitor.

Preferably, the power transmission device further includes a second device arranged in the second housing case, provided spaced apart from second capacitor. The distance between the second shield and the second capacitor is greater than the distance between the second device and the second capacitor.

Preferably, the second capacitor includes a third electrode, and a fourth electrode arranged opposite to the third electrode with a distance therebetween. The second anchor member includes a second contact face in contact with the second capacitor. A region of the second contact face, located between the third electrode and the fourth electrode, has a trench formed.

Preferably, the second shield includes a bottom plate, and a second peripheral wall formed erecting from the bottom plate. The second shield has a second opening formed, opposite to the bottom plate. The second housing case includes an insulative second lid closing the second opening, and a second support provided at the second lid, and supporting the second capacitor. The second capacitor includes a third electrode, and a fourth electrode arranged opposite to the third electrode with a distance therebetween. A region of an inner circumferential face of the second support, located between the third electrode and the fourth electrode, has a trench formed.

Preferably, the second capacitor includes a third electrode, and a fourth electrode arranged opposite to the third electrode with a distance therebetween. The second anchor member includes a third holder formed so as to cover a circumferential face of the second capacitor. A region of an inner circumferential face of the third holder, located between the third electrode and the fourth electrode, has a trench formed.

Preferably, the second capacitor includes the third electrode, and a fourth electrode arranged opposite to the third electrode with a distance therebetween. The second anchor member includes a fourth holder formed so as to cover a circumferential face of the second capacitor. A region of an inner circumferential face of the fourth holder, located between the third electrode and the fourth electrode, has a hole formed.

Preferably, the difference between the natural frequency of the power transmission unit and the natural frequency of the power reception unit is less than or equal to 10% the natural frequency of the power reception unit. Preferably, the coupling coefficient of the power transmission unit and the power reception unit is less than or equal to 0.1.

Preferably, the power transmission unit transmits electric power to the power reception unit through at least one of a magnetic field developed between the power reception unit and the power transmission unit, and oscillating at a particular frequency, and an electric field developed between the power reception unit and the power transmission unit, and oscillating at a particular frequency.

A power transfer system according to the present invention includes a power transmission device having a power transmission unit, and a power reception device. The power reception device includes a power reception unit receiving electric power in a non-contact manner from the power transmission unit, and including a first capacitor, a first housing case housing the power reception unit inside, and a first anchor member anchoring the first capacitor. The first housing case includes a first shield defining a region where an electromagnetic field developed around the power reception unit is emitted. The first capacitor is anchored by the first anchor member at a position spaced apart from the first shield.

A power transfer system according to the present invention includes a power reception device having a power reception unit, and a power transmission device. The power transmission device transmits electric power in a non-contact manner to the power reception unit, and includes a second capacitor, a second housing case housing the power transmission unit inside, and a second anchor member anchoring the second capacitor. The second housing case includes a second shield defining a region where an electromagnetic field developed around the power transmission unit is emitted. The second capacitor is anchored by the second anchor member at a position spaced apart from the second shield.

Advantageous Effects of Invention

According to the power reception device, the power transmission device, and the power transfer system of the present invention, the capacitor can be anchored, and the capacitor and the shield can be arranged spaced apart from each other.

DESCRIPTION OF EMBODIMENTS

Figure 1:
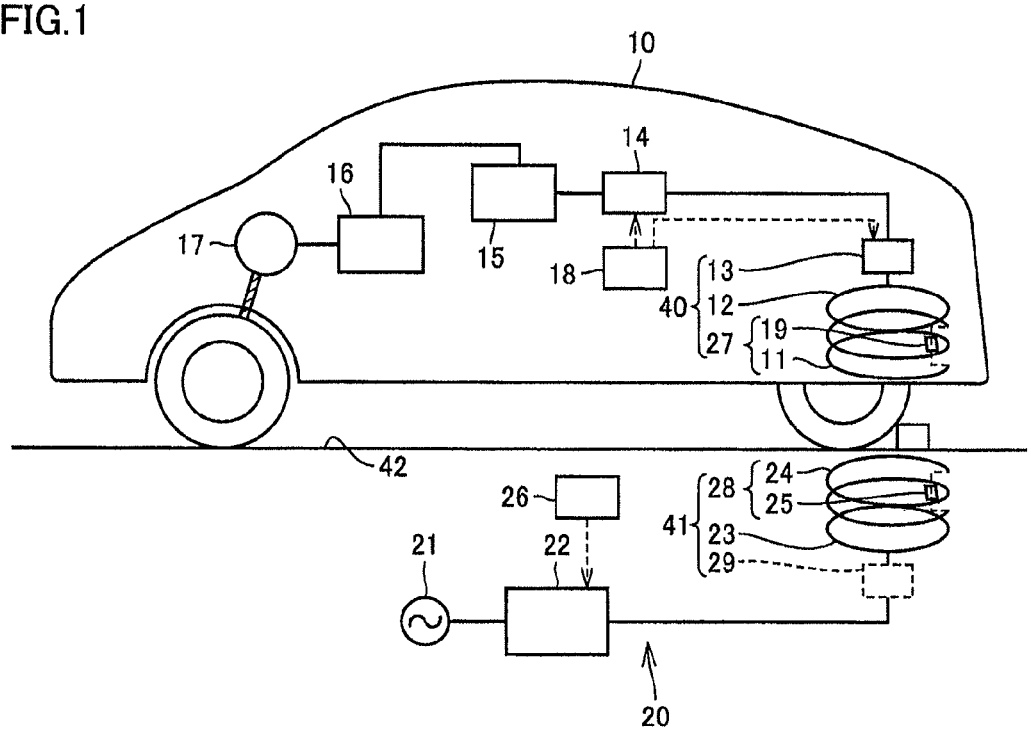
FIG. 1 is a schematic diagram for describing a power reception device, a power transmission device, and a power transfer system according to an embodiment.

A power reception device and a power transmission device according to a first embodiment of the present invention, and a power transfer system including the power transmission device and power reception device will be described with reference to FIGS. 1-27. Although a plurality of modification examples will be described in the present embodiment, an appropriate combination of the configuration disclosed in each modification example is intended from the beginning in the present application. FIG. 1 is a schematic diagram for describing a power reception device, a power transmission device, and a power transfer system according to the first embodiment.

The power transfer system according to the first embodiment includes an electric powered vehicle 10 including a power reception device 40, and an external power feeding device 20 including a power transmission device 41. Electric powered vehicle 10 stops at a predetermined position of a parking space 42 where power transmission device 41 is provided, and power reception device 40 receives electric power from power transmission device 41 in a non-contact manner.

Parking space 42 is provided with a wheel block and/or line such that electric powered vehicle 10 can stop at a predetermined position.

External power feeding device 20 includes a high frequency electric power driver 22 connected to an AC power source 21, a control unit 26 controlling the driving of high frequency electric power driver 22 and the like, and power transmission device 41 connected to high frequency electric power driver 22. Power transmission device 41 includes a coil 23 connected to high frequency electric power driver 22, a power transmission unit 28, and an impedance adjuster 29. As indicated by the broken line in FIG. 1, impedance adjuster 29 may be arranged between high frequency electric power driver 22 and coil 23. Power transmission unit 28 includes a coil 24 receiving electric power from coil 23 by electromagnetic induction, and a capacitor 25 connected across coil 24. Thus, power transmission unit 28 has an electric circuit including coil 24 and capacitor 25. In the case where coil 24 is of the multilayer winding type, stray capacitance is developed at coil 24.

Power transmission unit 28 includes an electric circuit formed by the inductance of coil 24, and the capacitance of the stray capacitance of coil 24 and capacitor 25.

Electric powered vehicle 10 includes power reception device 40, a DC/DC converter 14 connected to power reception device 40, a battery 15 connected to DC/DC converter 14, a power control unit (PCU) 16, a motor unit 17 connected to power control unit 16, and a vehicle ECU (Electronic Control Unit) 18 controlling the driving of DC/DC converter 14, power control unit 16, and the like. Electric powered vehicle 10 according to the present embodiment is not limited to a hybrid vehicle including an engine not shown, and may include a vehicle driven by a motor such as an electric vehicle or fuel cell vehicle.

DC/DC converter 14 adjusts the voltage of the DC current supplied from a rectifier 13 for supply to battery 15. DC/DC converter 14 is not a mandatory element, and may be omitted.

Power control unit 16 includes a converter connected to battery 15, and an inverter connected to the converter. The converter adjusts (boosts) the DC current supplied from battery 15 for supply to the inverter. The inverter converts the DC current supplied from the converter into AC current for supply to motor unit 17.

Motor unit 17 is a 3-phase AC motor, for example, driven by the AC current supplied from the inverter in power control unit 16.

Electric powered vehicle 10 further includes, in the case of a hybrid vehicle, an engine and a power split mechanism. Motor unit 17 includes a motor generator mainly functioning as a power generator, and a motor generator mainly functioning as an electric motor.

Power reception device 40 includes a power reception unit 27, a coil 12, and a rectifier 13 connected to coil 12 and converter 14.

Power reception unit 27 includes a coil 11 and a capacitor 19. Coil 11 has stray capacitance. Therefore, power reception unit 27 has an electric circuit formed by the inductance of coil 11 and the capacitance of coil 11 and capacitor 19.

In the power transfer system according to the present embodiment, the difference between the natural frequency of power transmission unit 28 and the natural frequency of power reception unit 27 is less than or equal to 10% the natural frequency of power reception unit 27 or power transmission unit 28. By setting the natural frequency of each of power transmission unit 28 and power reception unit 27 in such a range, the electric power transmission efficiency can be improved. If the natural frequency difference becomes greater than 10% the natural frequency of power reception unit 27 or power transmission unit 28, the electric power transmission efficiency becomes lower than 10%, leading to the disadvantage that the time required for charging battery 15 becomes longer.

As used herein, the natural frequency of power transmission unit 28 implies, when capacitor 25 is not provided, the oscillation frequency when the electric circuit formed by the inductance of coil 24 and the capacitance of coil 24 exhibits free oscillation. In the case where capacitor 25 is provided, the natural frequency of power transmission unit 28 implies the oscillation frequency when the electric circuit formed by the capacitance of coil 24 and capacitor 25 and the inductance of coil 24 exhibits free oscillation. In the aforementioned electric circuit, the natural frequency when the damping force and electric resistance is zero or substantially zero is also referred to as the resonant frequency of power transmission unit 28.

Similarly, the natural frequency of power reception unit 27 implies, when capacitor 19 is not provided, the oscillation frequency when the electric circuit formed by the inductance of coil 11 and the capacitance of coil 11 exhibits free oscillation. In the case where capacitor 19 is provided, the natural frequency of power reception unit 27 implies the oscillation frequency when the electric circuit formed by the capacitance of coil 11 and capacitor 19 and the inductance of coil 11 exhibits free oscillation. In the aforementioned electric circuit, the natural frequency when the damping force and electric resistance is zero or substantially zero is also referred to as the resonant frequency of power reception unit 27.

Figure 2:
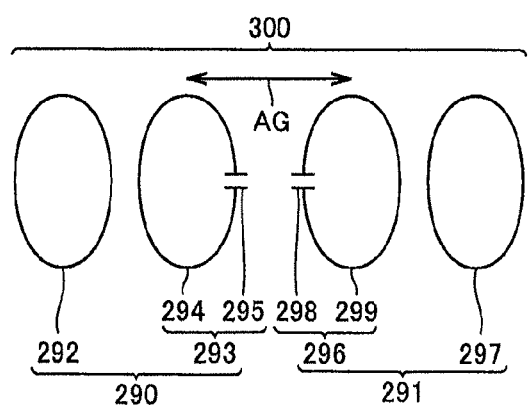
FIG. 2 represents a simulation model of the power transfer system.

A simulation result of analyzing the relationship between the natural frequency difference and the electric power transmission efficiency will be described with reference to FIGS. 2 and 3. FIG. 2 represents a simulation model of the power transfer system. Power transfer system 300 includes a power transmission device 290 and a power reception device 291. Power transmission device 290 includes an electromagnetic induction coil 292, and a power transmission unit 293. Power transmission unit 293 includes a resonant coil 294, and a capacitor 295 provided at resonant coil 294.

Power reception device 291 includes a power reception unit 296, and an electromagnetic induction coil 297. Power reception unit 296 includes a resonant coil 299, and a capacitor 298 connected to resonant coil 299.

The inductance of resonant coil 294 is inductance Lt, whereas the capacitance of capacitor 295 is capacitance C1. The inductance of resonant coil 299 is inductance Lr, whereas the capacitance of capacitor 298 is capacitance C2. By setting such parameters, natural frequency f1 of power transmission unit 293 is represented by equation (1) set forth below. Natural frequency f2 of power reception unit 296 is represented by equation (2) set forth below.

$$f1 = 1/\{2\pi(Lt \times C1)^{1/2}\} \tag{1}$$

$$f2 = 1/\{2\pi(Lr \times C2)^{1/2}\} \tag{2}$$

Figure 3:
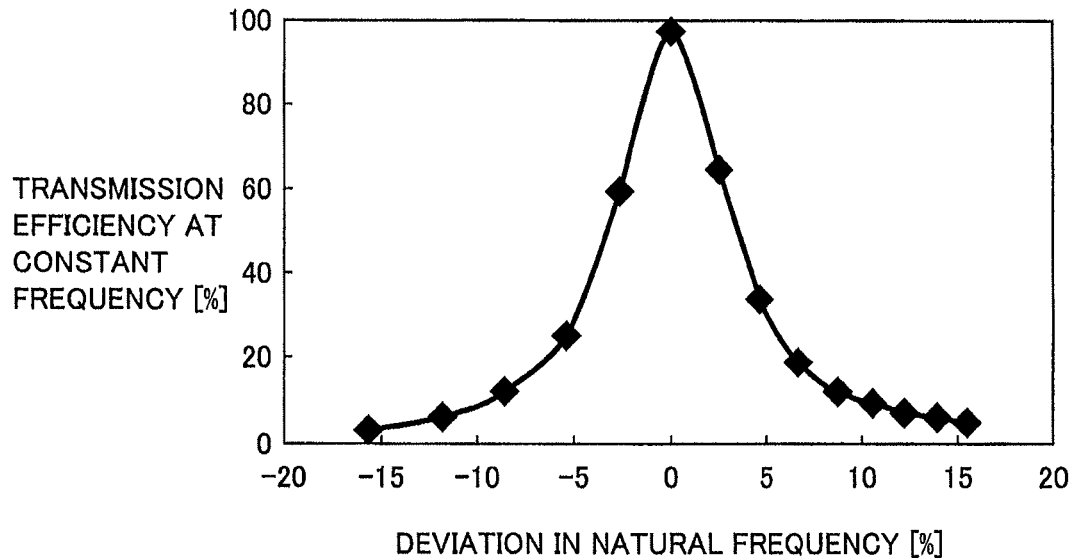
FIG. 3 is a graph representing the simulation result.

The relationship between the deviation in the natural frequency of power transmission unit 293 and power reception unit 296 and the electric power transmission efficiency in the case where inductance Lr and capacitances C1 and C2 are fixed and inductance Lt alone is altered is shown in FIG. 3. In this simulation, the relative positional relationship between resonant coil 294 and resonant coil 299 is fixed, and the frequency of the current supplied to power transmission unit 293 is constant.

In the graph of FIG. 3, the horizontal axis represents the deviation (%) in natural frequency, whereas the vertical axis represents the transmission efficiency (%) at a constant frequency. The deviation (%) in natural frequency is represented by equation (3) set forth below.

$$\text{(Deviation in natural frequency)} = \{(f1 - f2)/f2\} \times 100 (\%) \tag{3}$$

It is appreciated from FIG. 3 that the electric power transmission efficiency is in the vicinity of 100% when the deviation (%) in natural frequency is ±0%. When the deviation (%) in natural frequency is ±5%, the electric power transmission efficiency becomes 40%. When the deviation (%) in natural frequency is ±10%, the electric power transmission efficiency becomes 10%. When the deviation (%) in natural frequency is ±15%, the electric power transmission efficiency becomes 5%. In other words, it is appreciated that the electric power transmission efficiency can be improved by setting each natural frequency of the power transmission unit and the power reception unit such that the absolute value (difference in natural frequency) of the deviation (%) in natural frequency is in the range less than or equal to 10% the natural frequency of power reception unit 296. It is also appreciated that the electric power transmission efficiency can be further improved by setting each natural frequency of the power transmission unit and the power reception unit such that the absolute value of the deviation (%) in natural frequency is less than or equal to 5% the natural frequency of power reception unit 296. For the simulation software, electromagnetic field analysis software (JMAG (registered trademark): JSOL Company Limited) is employed.

The operation of the power transfer system according the present embodiment will be described hereinafter.

In FIG. 1, the AC power from high frequency electric power driver 22 is supplied to coil 23. The flow of predetermined AC current to coil 23 causes AC current to flow also to coil 24 by electromagnetic induction. At this stage, electric power is supplied to coil 23 such that the frequency of the AC current flowing through coil 24 attains a particular frequency.

The flow of current of a particular frequency to coil 24 causes development of an electromagnetic field around coil 24 oscillating at a particular frequency.

Coil 11 is arranged within a predetermined range from coil 24 such that coil 11 receives electric power from the electromagnetic field developed around coil 24.

In the present embodiment, the so-called helical coil is employed for coil 11 and coil 24. Therefore, mainly a magnetic field oscillating at a particular frequency is formed around coil 24 such that coil 11 receives electric power from the magnetic field.

The magnetic field of a particular frequency developed around coil 24 will be described hereinafter. "Magnetic field of a particular frequency" typically has relevance to the electric power transmission efficiency and the frequency of current supplied to coil 24. First, the relationship between the electric power transmission efficiency and the frequency of current supplied to coil 24 will be described. The electric power transmission efficiency when electric power is transmitted from coil 24 to coil 11 varies depending upon various factors such as the distance between coil 24 and coil 11. For example, the natural frequency (resonant frequency) of power transmission unit 28 and power reception unit 27 is set as natural frequency 10, the frequency of the current supplied to coil 24 is set as frequency f3, whereas the air gap between coils 11 and 24 is set as air gap AG.

Figure 4:
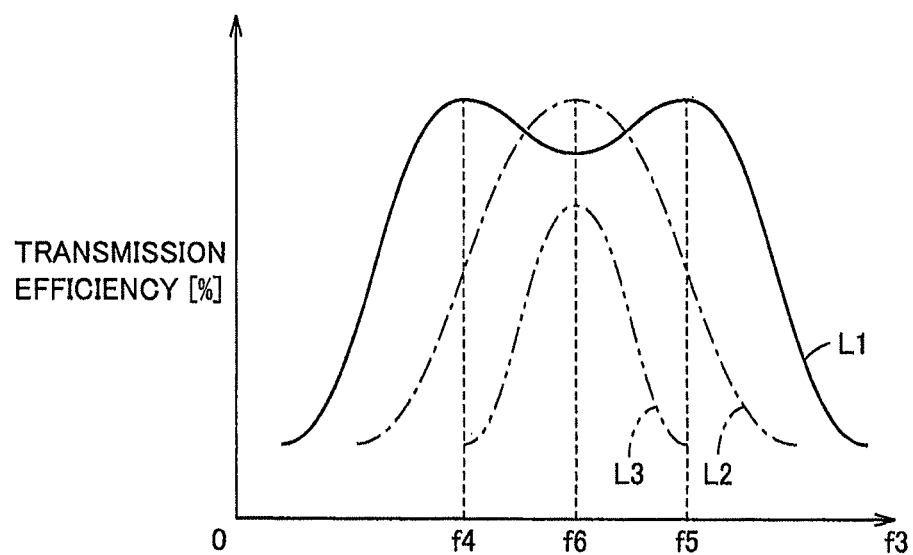
FIG. 4 is a graph representing the relationship between electric power transmission efficiency and the frequency of a current supplied to a resonant coil, when the air gap is altered with the natural frequency fixed.

FIG. 4 represents a graph indicating the relationship between the electric power transmission efficiency and frequency f3 of the current supplied to coil 24, when the air gap AG is altered with natural frequency f0 fixed.

In the graph of FIG. 4, the horizontal axis represents frequency f3 of the current supplied to coil 24, whereas the vertical axis represents the electric power transmission efficiency (%). Efficiency line L1 schematically represents the relationship between the electric power transmission efficiency and frequency f3 of the current supplied to coil 24 when air gap AG is small. As represented by efficiency line L1, the peak of the electric power transmission efficiency occurs at frequencies f4, f5 ((f4 <f5) when air gap AG is small. When air gap AG is increased, the two peaks of the high electric power transmission efficiency change so as to come closer to each other. By increasing air gap AG greater than a predetermined distance, the peak of the electric power transmission efficiency is rendered unitary, and the electric power transmission efficiency attains the peak when the frequency of current supplied to coil 24 is at frequency f6, as shown by efficiency line L2. If air gap AG is further increased than the state of efficiency line L2, the peak of the electric power transmission efficiency becomes smaller, as indicated by efficiency line L3.

As the method of improving the electric power transmission efficiency, the first scheme set forth below, for example, may be considered. The first possible scheme is to change the characteristics of the electric power transmission efficiency between power transmission unit 28 and power reception unit 27 by altering the capacitance of capacitor 25 and/or 19 with the frequency of the current supplied to coil 24 shown in FIG. 1 constant according to air gap AG. Specifically, the capacitance of capacitor 25 and capacitor 19 is adjusted such that the electric power transmission efficiency attains the peak with the frequency of the current supplied to coil 24 at a constant state. In this scheme, the frequency of the current flowing through coils 24 and 11 is constant, independent of the degree of air gap AG. As the scheme of altering the characteristics of the electric power transmission efficiency, the scheme of utilizing a matching unit provided between power transmission device 41 and high frequency electric power driver 22 or the scheme utilizing converter 14 and the like can be employed.

The second scheme is to adjust the frequency of the current supplied to coil 24 based on the degree of air gap AG. For example, in the case where the electric power transmission characteristics correspond to efficiency line L1 in FIG. 4, a current of frequency f4 or f5 is supplied to coil 24. In the case where the frequency characteristics correspond to efficiency lines L2 and L3, a current of frequency f6 is supplied to coil 24. In this case, the frequency of the current flowing to coils 24 and 11 will be altered in accordance with the degree of air gap AG.

The frequency of the current flowing through coil 24 is a fixed constant frequency in the first scheme, and the frequency of the current flowing through coil 24 varies appropriately according to air gap AG in the second scheme. By the first scheme, the second scheme, and the like, a current of a particular frequency set such that the electric power transmission efficiency is increased is supplied to coil 24. The flow of a current of a particular frequency to coil 24 causes development of a magnetic field (electromagnetic field) oscillating at a particular frequency around coil 24. Power reception unit 27 receives the electric power from power transmission unit 28 through a magnetic field developed between power reception unit 27 and power transmission unit 28 and oscillating at a particular frequency. Therefore, "magnetic field oscillating at a particular frequency" is not necessarily restricted to a magnetic field of a fixed frequency. Although the above-described example is based on the case where the frequency of the current flowing to coil 24 is set focusing on air gap AG, it is to be noted that the electric power transmission efficiency will vary depending on another factor such as the deviation of coil 24 and coil 11 in the horizontal direction. There may be the case where the frequency of the current supplied to coil 24 is adjusted based on the relevant another factor.

Although the present embodiment is described based on the case where a helical coil is employed as the resonant coil, application of an antenna such as a meander line for the resonant coil causes development of an electric field of a particular frequency around coil 24 by the flow of current of a particular frequency to coil 24. Electric power transfer is conducted between power transmission unit 28 and power reception unit 27 through this electric field.

Figure 5:
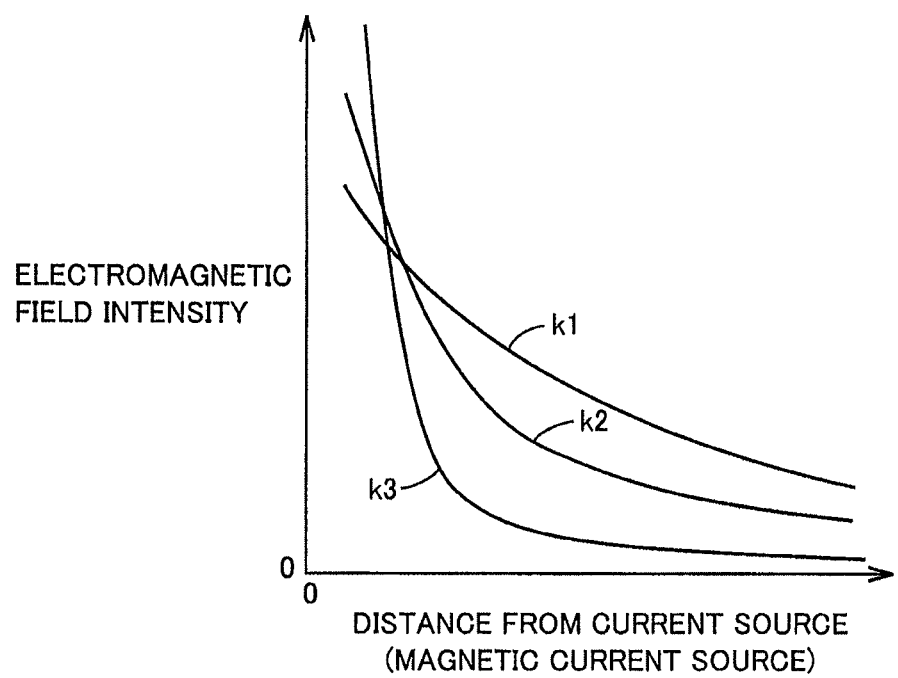
FIG. 5 represents the relationship between the distance from a current source (magnetic current source) and the electromagnetic field intensity.

In the power transfer system according to the present embodiment, the power transmission and power reception efficiency is improved by taking advantage of the near field (evanescent field) where "electrostatic field" of the electromagnetic field is dominant. FIG. 5 represents the relationship between the distance from the current source (magnetic current source) and the intensity of the electromagnetic field. Referring to FIG. 5, the electromagnetic field is composed of three components. Line k1 represents a component inversely proportional to the distance from the wave source, and is referred to as "radiation field". Line k2 represents a component inversely proportional to the square of the distance from the wave source, and is referred to as "induction field". Line k3 represents a component inversely proportional to the cube of the distance from the wave source, and is referred to as "electrostatic field". The distance at which the intensity of "radiation field" and "induction field" and "electrostatic field" is substantially equal can be represented as $\lambda/2\pi$ where "$\lambda$" is the wavelength of the electromagnetic field.

"Electrostatic field" is the region where the intensity of the electromagnetic wave decreases rapidly as a function of distance from the wave source. In the power transfer system according to the present embodiment, energy (electric power) is transmitted taking advantage of the near field (evanescent field) where this "electrostatic field" is dominant. In other words, resonance is caused between power transmission unit 28 and power reception unit 27 having near natural frequency (for example, a pair of LC resonant coils) in the near field where "electrostatic field" is dominant to transmit energy (electric power) from power transmission unit 28 to the other power reception unit 27. Since this "electrostatic field" does not pass on energy far away, the resonance method allows power transmission with lower energy loss as compared to an electromagnetic field that transmits energy (electric power) by "radiation field" far away.

Thus in the power transfer system according to the present embodiment, electric power is transmitted from power transmission device 41 to the power reception device by power transmission unit 28 and power reception unit 27 resonating through an electromagnetic field. The coupling coefficient (κ) between power transmission unit 28 and power reception unit 27 is less than or equal to 0.1. In electric power transfer generally utilizing electromagnetic induction, the coupling coefficient (κ) between the power transmission unit and the power reception unit is in the vicinity of 1.0.

The coupling between power transmission unit 28 and power reception unit 27 in electric power transfer of the present embodiment is referred to as, for example, "magnetic resonant coupling", "magnetic field resonant coupling", "electromagnetic field resonant coupling" or "electric field resonant coupling".

"Electromagnetic field resonant coupling" implies coupling including any of "magnetic resonant coupling", "magnetic field resonant coupling" and "electric field resonant coupling".

Since a coil-shape antenna is employed for coil 24 of power transmission unit 28 and coil 11 of power reception unit 27 described in the present specification, power transmission unit 28 and power reception unit 27 are coupled mainly by a magnetic field. Power transmission unit 28 and power reception unit 27 achieve "magnetic resonant coupling" or "magnetic field resonant coupling".

For coils 24 and 11, an antenna such as a meander line can be employed, for example. In this case, power transmission unit 28 and power reception unit 27 are coupled mainly by an electric field. At this stage, power transmission unit 28 and power reception unit 27 achieve "electric field resonant coupling".

Figure 6:
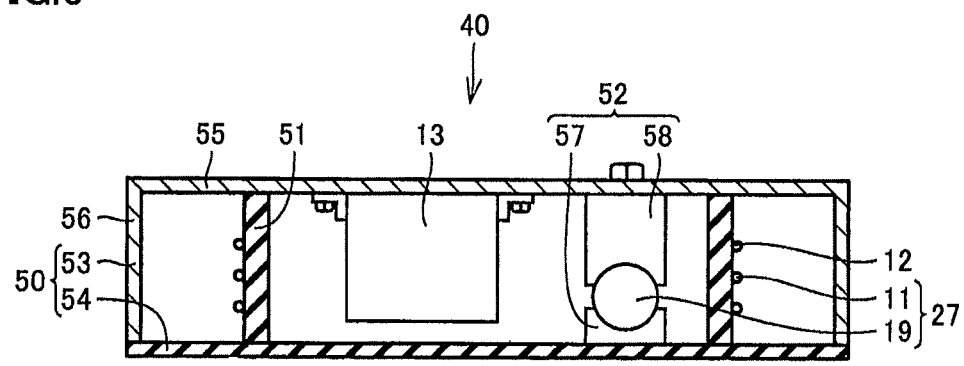
FIG. 6 is a side sectional view of the power reception device.

The configuration of power transmission device 41 and power reception device 40 will be described in detail hereinafter. FIG. 6 is a side sectional view of power reception device 40, whereas FIG. 7 is a sectional view of power reception device 40.

Figure 7:
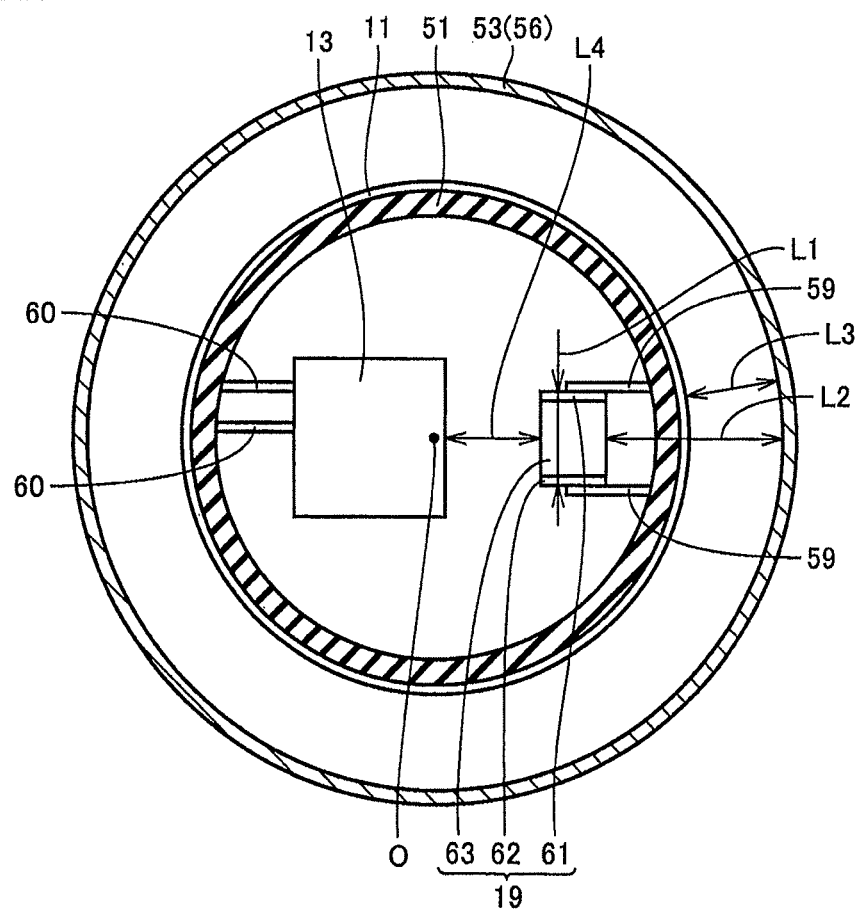
FIG. 7 is a sectional view of the power reception device

As shown in FIGS. 6 and 7, power reception device 40 includes a housing case 50, a support member 51 housed in housing case 50, and an anchor member 52 housed in housing case 50.

Power reception unit 27 and rectifier 13 are housed in housing case 50. Housing case 50 includes a shield 53 having an opening formed, and a lid 54 formed so as to close the opening.

Shield 53 includes a top plate 55, and a peripheral wall 56 formed suspending downwards from the peripheral edge of top plate 55. The aforementioned opening is formed at a position opposite to top plate 55.

Shield 53 is formed of a metal material such as copper. Lid 54 is formed of, for example, insulative resin material.

The electromagnetic field (magnetic field) developed around coil 11 can pass through lid 54. The electromagnetic field (magnetic field) developed around coil 11 is emitted outwards through the opening at shield 53. Shield 53 reflects and absorbs the electromagnetic wave emitted from coil 11. Shield 53 defines the region where an electromagnetic field is developed around coil 11.

Support member 51 is formed in a tubular shape in the example of FIGS. 6 and 7. Coil 11 and coil 12 are attached to the outer circumferential face of support member 51. In support member 51 are arranged a rectifier 13, a capacitor 19, and an anchor member 52. Support member 51 is not limited to a tubular insulative member. For example, support member 51 may be formed by a plurality of rod-like supports arranged annularly.

Rectifier 13 is anchored to top plate 55. Capacitor 19 is anchored to lid 54 by anchor member 52.

Capacitor 19 is connected to coil 11 by wiring 59. Rectifier 13 is connected to coil 12 by wiring 60.

As shown in FIG. 7, capacitor 19 is arranged spaced apart from shield 53. Therefore, even if high voltage is applied to capacitor 19 in power transmission or the like, the flow of current between capacitor 19 and shield 53 is suppressed.

Particularly, since capacitor 19 is anchored by anchor member 52 in the present embodiment, the spaced-apart state between capacitor 19 and shield 53 can be maintained even if power reception device 40 is inclined or external force is applied to power reception device 40.

Further, since capacitor 19 is arranged above lid 54 formed of an insulative material, the flow of current between capacitor 19 and shield 53 is suppressed.

Figure 8:
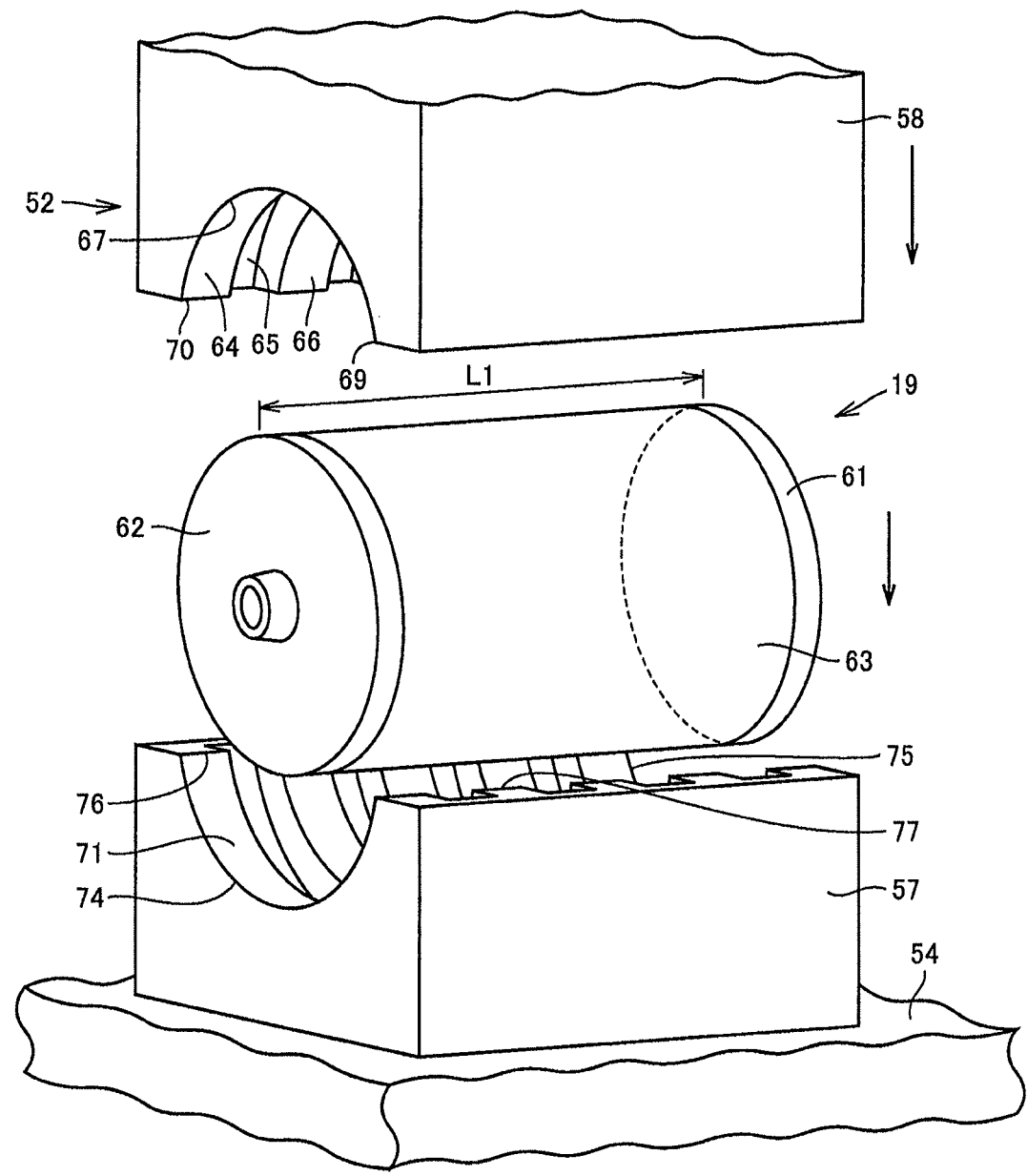
FIG. 8 is an exploded perspective view of a capacitor and an anchor member.

FIG. 8 is an exploded perspective view of capacitor 19 and anchor member 52. As shown in FIGS. 8 and 7, capacitor 19 includes an electrode plate 61, an electrode plate 62 provided opposite to electrode plate 61 with a distance therebetween, and a dielectric 63 arranged between electrode plate 61 and electrode plate 62. The distance between electrode plate 61 and electrode plate 62 is a distance L1.

During electric power transfer, large voltage is applied across electrode plate 61 and electrode plate 62. Distance L1 between electrode plate 61 and electrode plate 62 is ensured such that, when a large voltage is applied between electrode plates 61 and 62, discharging does not occur across electrode plate 61 and electrode plate 62.

Assuming that the distance between capacitor 19 and shield 53 is distance L2, distance L2 is greater than distance L1.

Thus, since capacitor 19 and shield 53 are arranged apart from each other, the flow of current between capacitor 19 and shield 53 can be suppressed.

Moreover, since capacitor 19 is arranged above lid 54 formed of an insulative material, the flow of current between capacitor 19 and lid 54 can be suppressed. Thus, the distance of insulation is ensured between capacitor 19 and shield 53.

Capacitor 19 is arranged in support member 51, and when the distance between coil 11 and shield 53 is L3, distance L2 is greater than distance L3. Accordingly, the distance between capacitor 19 and shield 53 is so great that the flow of current between capacitor 19 and shield 53 can be suppressed.

In FIG. 7, distance L2 is greater than distance L4 that is the distance between rectifier 13 and capacitor 19. Distance L4 is greater than distance L1, suppressing current to flow between rectifier 13 and capacitor 19.

Thus, by setting distance L2 longer than distance L4 at which the distance of insulation is ensured, the flow of current between capacitor 19 and shield 53 can be suppressed.

Figure 9:
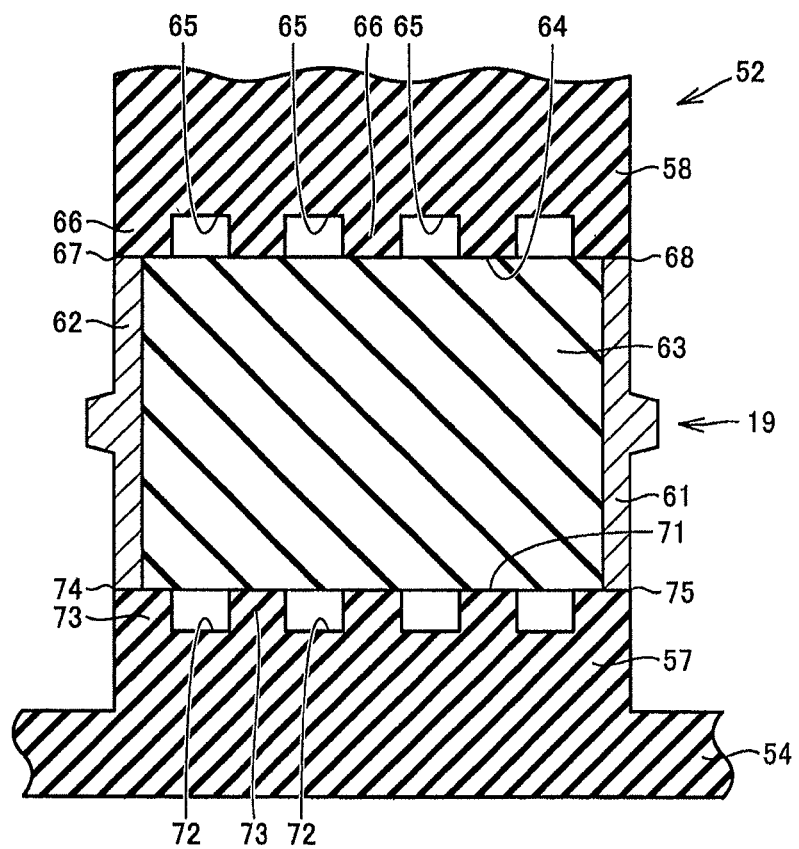
FIG. 9 is a sectional view of the anchor member and capacitor.

FIG. 9 is a sectional view of anchor member 52 and capacitor 19. Anchor member 52 includes an anchorage 58 having an upper end secured to top plate 55 shown in FIG. 6, and a support 57 formed on the top face of lid 54. Anchorage 58 and support 57 are both formed of an insulative material, for example, insulative resin.

At the lower end of anchorage 58 is formed a contact face 64 in contact with capacitor 19. In the present embodiment, capacitor 19 is formed in a columnar shape. Contact face 64 is formed to curve in a circular form along the circumferential face of capacitor 19.

The edge region of contact face 64 includes a curving section 67 bending along the circumference of capacitor 19, a curving section 68 formed spaced apart from curving section 67, and side sections 69 and 70 formed so as to connect curving section 67 and curving section 68.

The region of contact face 64 located between electrode plate 61 and electrode plate 62 has a plurality of trenches 65 formed spaced apart.

Trenches 65 are formed spaced apart in the direction from electrode plate 62 to electrode plate 61. A contact section 66 is formed adjacent to trench 65.

In the example shown in FIGS. 8 and 9, trench 65 is formed extending from side section 70 to side section 69. Contact section 66 is formed extending from side section 70 to side section 69. A plurality of contact sections 66 are in contact with capacitor 19.

Therefore, the creepage distance between electrode plate 62 and electrode plate 61 at contact face 64 of anchorage 58 is lengthened, suppressing the occurrence of discharging between electrode plate 62 and electrode plate 61.

Various forms can be employed for the shape of trench 65. For example, a plurality of trenches may be arranged in a staggered manner so as to increase the creepage distance between electrode plate 62 and electrode plate 61.

Support 57 is formed so as to protrude upwards from the top face of lid 54. At the top face of support 57, a support face 71 supporting the circumferential face of capacitor 19 is formed. Capacitor 19 is anchored by being sandwiched between support face 71 and contact face 64.

The edge of support face 71 includes a curving section 74 bending along the circumference of capacitor 19, a curving section 75 arranged spaced apart from curving section 74, and side sections 76 and 77 connecting curving section 74 and curving section 75.

At support face 71, a plurality of trenches 72 are formed spaced apart in the direction from electrode plate 62 to electrode plate 61. A contact section 73 is formed at the region adjacent to trench 72. The circumferential face of capacitor 19 is in contact with contact section 73.

Therefore, similarly at support 57, the creepage distance between electrode plate 61 and electrode plate 62 is formed longer to suppress the occurrence of discharging between electrode plate 61 and electrode plate 62.

Although support face 71 is formed at the top face of support 57 in the present embodiment, support face 71 may be formed directly at the top face of lid 54. Various types of forms can be employed for the shape of trench 72.

Figure 10:
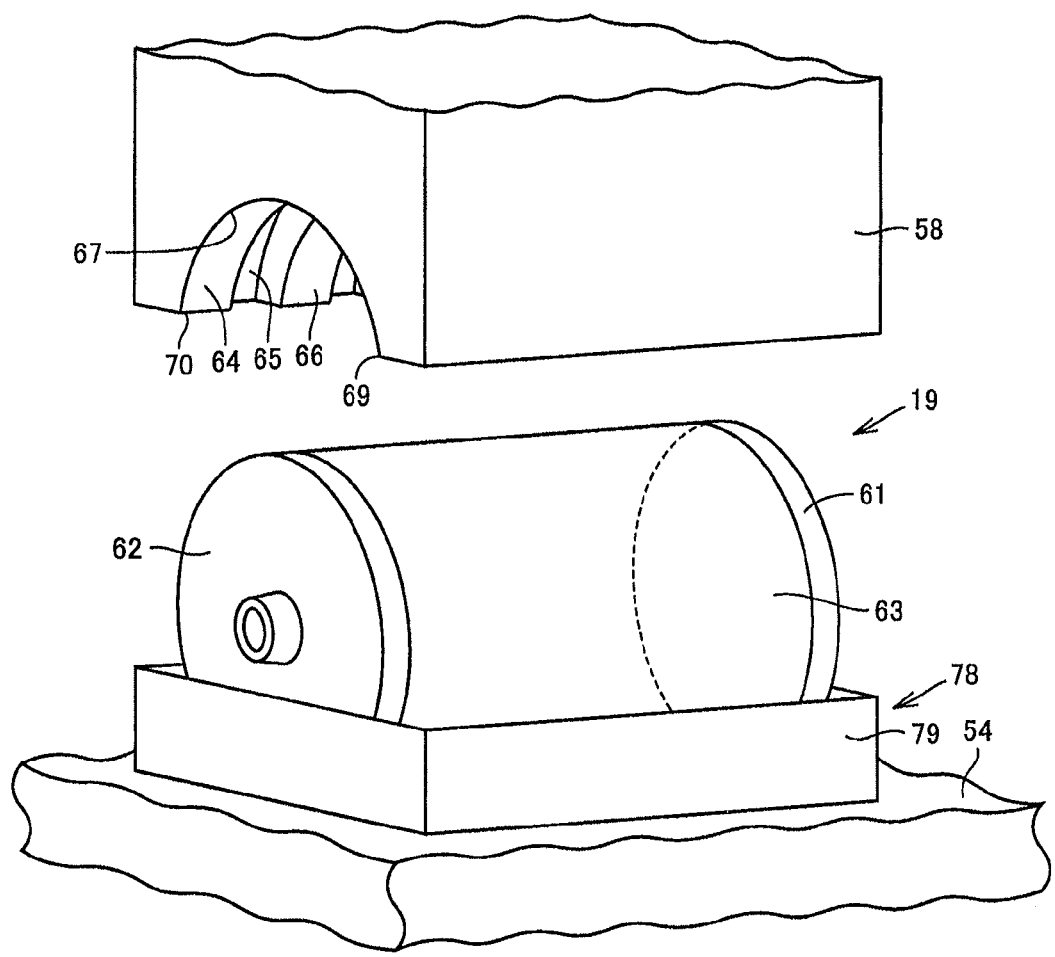
FIG. 10 is a perspective view of a first modification example of the anchor member.

FIG. 10 is a perspective view representing a first modification example of anchor member 52. In the example of FIG. 10, anchor member 52 includes an anchorage 58 supporting capacitor 19 from above, and a support member 78 formed on the top face of lid 54 for supporting capacitor 19.

Support member 78 includes a plurality of support walls 79 arranged annularly. Capacitor 19 is supported by support member 78.

In the example of FIG. 10, capacitor 19 is secured by anchorage 58 pressing capacitor 19 from above, and support member 78 supporting capacitor 19 from the bottom side. Accordingly, the rolling of capacitor 19 can be suppressed even if power reception device 40 is inclined.

Figure 11:
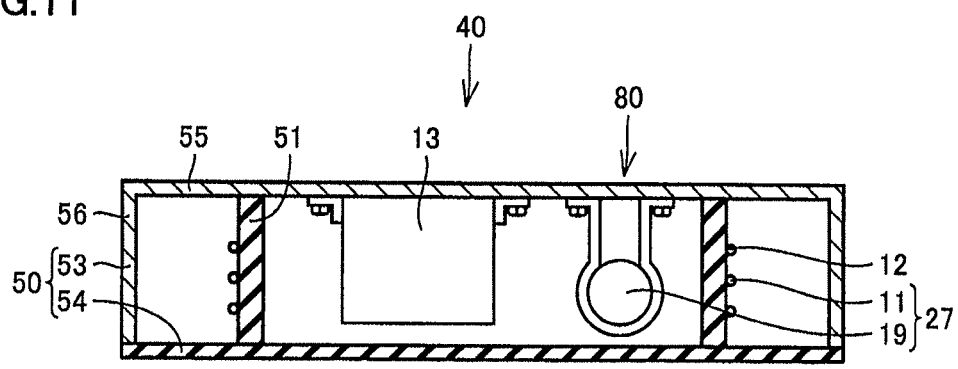
FIG. 11 is a sectional view of a power reception device representing a second modification example of the anchor member.

FIG. 11 is a sectional view of power reception device 40 representing a second modification example of an anchor member. In the example shown in FIG. 11, capacitor 19 is anchored by anchor member 80. Anchor member 80 itself is secured to top plate 55.

Figure 12:
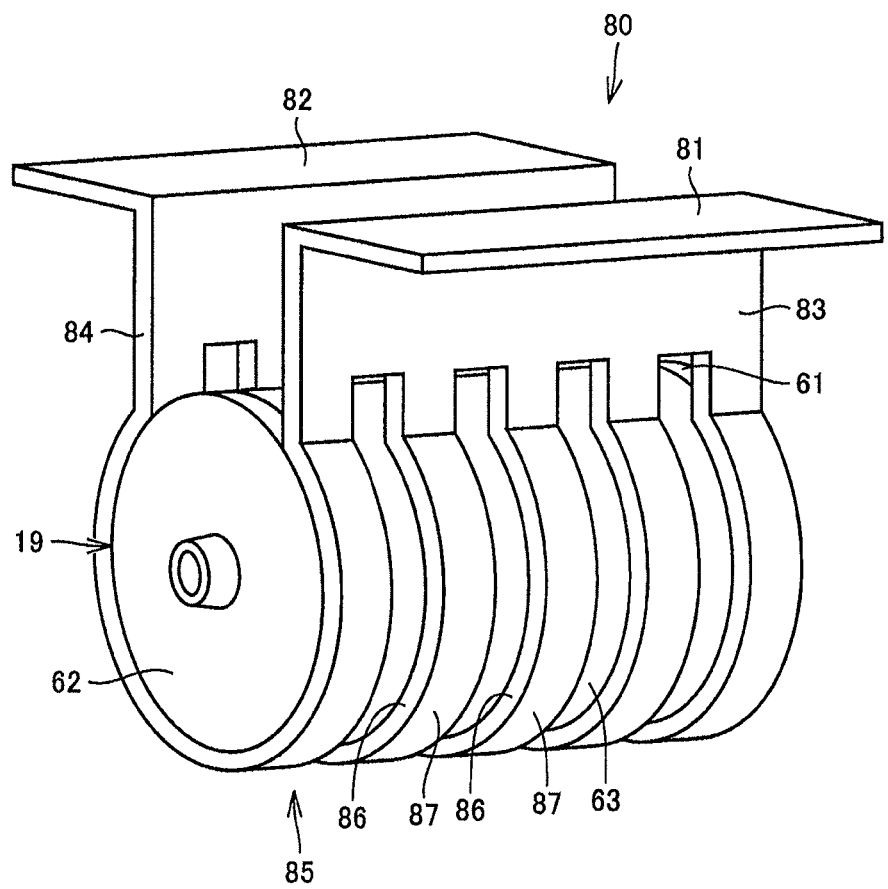
FIG. 12 is a perspective view of an anchor member.

FIG. 12 is a perspective view of anchor member 80. As shown in FIG. 12, anchor member 80 includes anchorages 81 and 82 secured to top plate 55 shown in FIG. 11, legs 83 and 84 formed suspending from anchorages 81 and 82, and a holder 85 holding capacitor 19, formed so as to cover the circumferential face of capacitor 19.

The region of holder 85 located between electrode plate 61 and electrode plate 62 has a plurality of holes 86 formed. Holes 86 are formed spaced apart in the direction from electrode plate 62 to electrode plate 61. At the regions adjacent to holes 86, a plurality of contact sections 87 in contact with capacitor 19 to support the same is formed.

Figure 13:
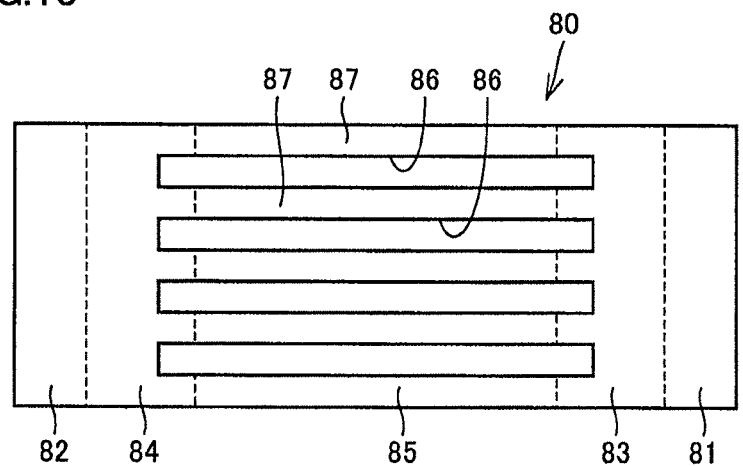
FIG. 13 is a development view of the anchor member shown in FIG. 12.

FIG. 13 is a development view of anchor member 80 shown in FIG. 12. Referring to FIG. 13, hole 86 is formed to arrive at leg 84 from leg 83.

Therefore, the creepage distance between electrode plate 61 and electrode plate 62 is long, even if capacitor 19 is anchored by anchor member 80 shown in FIGS. 13 and 12, allowing the occurrence of discharging between electrode plate 61 and electrode plate 62 to be suppressed.

Figure 14:
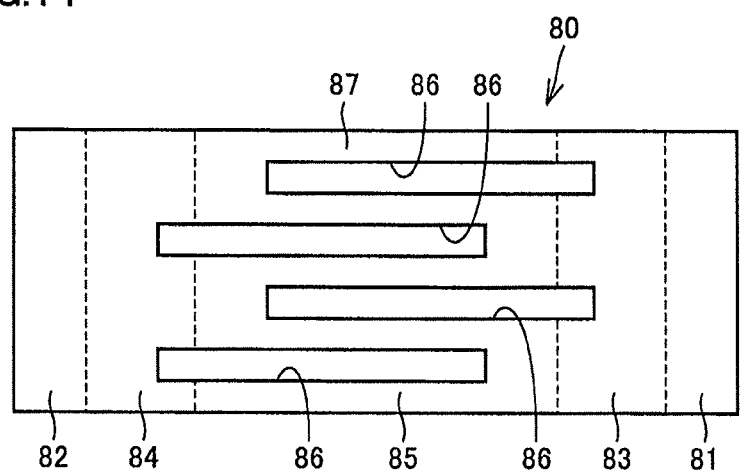
FIG. 14 is a development view of a first modification example of the anchor member shown in FIG. 12.

FIG. 14 is a development view representing a first modification example of anchor member 80. In the example of FIG. 14, a plurality of holes 86 are formed in a staggered manner. Similarly in the example of FIG. 14, the creepage distance between electrode plates 61 and 62 can be increased.

Figure 15:
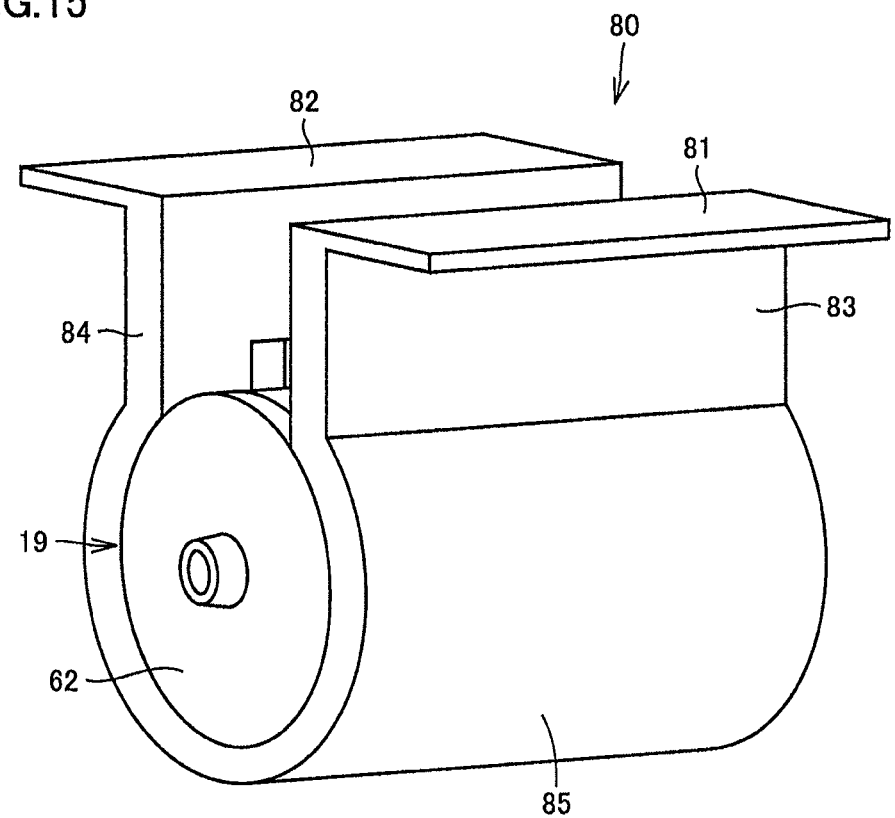
FIG. 15 is a perspective view of a second modification example of the anchor member shown in FIG. 12.

FIG. 15 is a perspective view representing a second modification example of anchor member 80. As shown in FIG. 15, anchor member 80 includes anchorages 81 and 82, legs 83 and 84 suspending from anchorages 81 and 82, and a holder 85 connected at the lower end of legs 83 and 84, holding capacitor 19.

Figure 16:
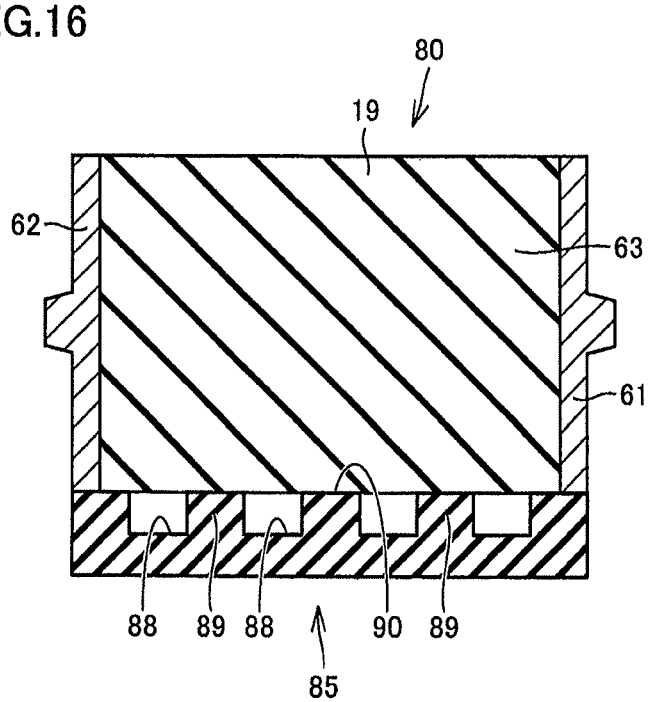
FIG. 16 is a sectional view of the anchor member shown in FIG. 15.

FIG. 16 is a sectional view of anchor member 80 shown in FIG. 15. Referring to FIG. 16, an inner circumferential face 90 of holder 85 has a plurality of trenches 88 formed spaced apart in the direction from electrode plate 61 to electrode plate 62. A contact section 89 is formed adjacent to trench 88.

Trench 88 is formed to extend from leg 83 towards leg 84 shown in FIG. 15. A plurality of contact sections 89 support the circumferential face of capacitor 19. Similarly in the examples shown in FIGS. 15 and 16, the creepage distance between electrode plate 61 and electrode plate 62 is long, suppressing the occurrence of discharging between electrode plate 61 and electrode plate 62.

Figure 17:
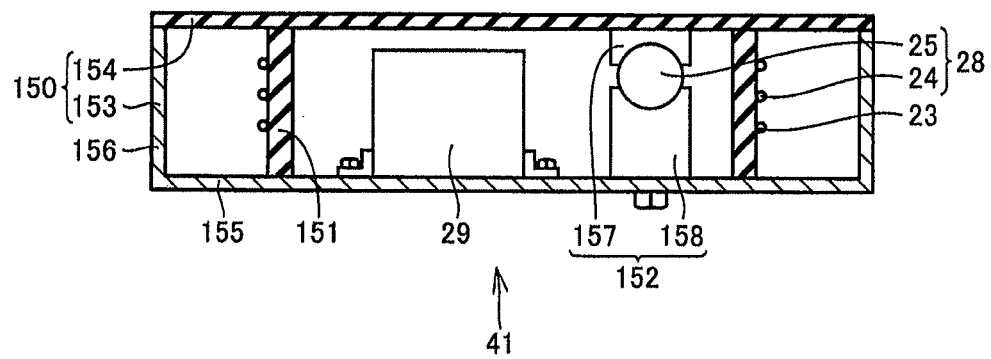
FIG. 17 is a side sectional view representing a power transmission device.
Figure 18:
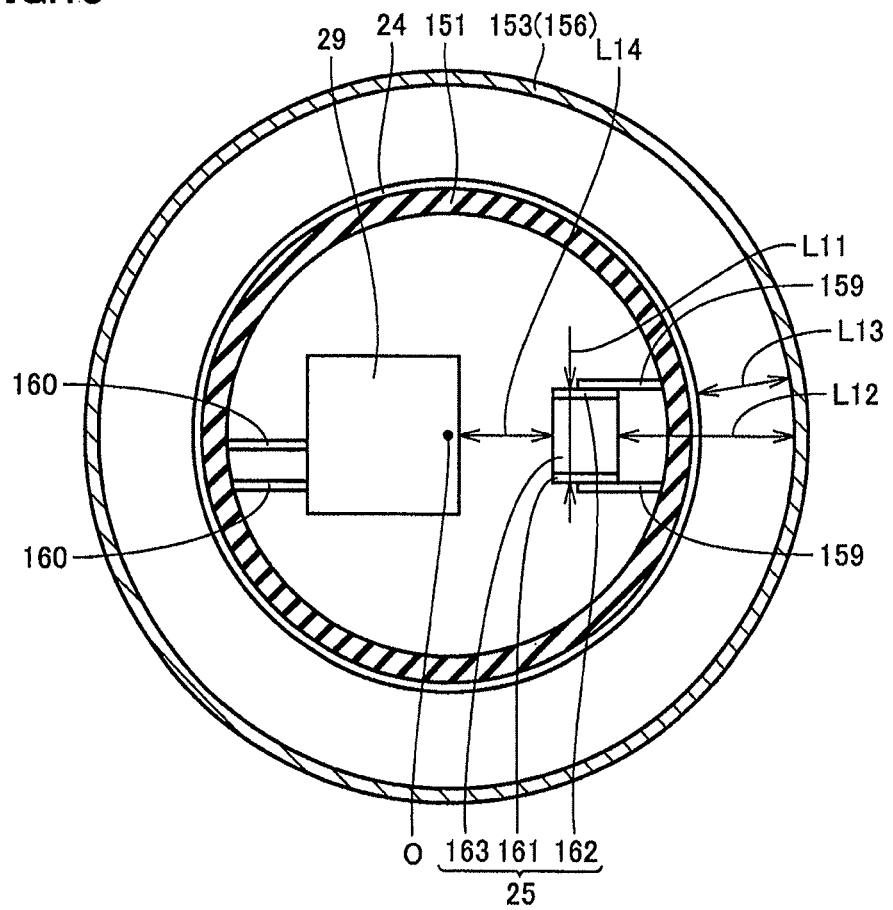
FIG. 18 is a sectional view of the power transmission device.

FIG. 17 is a side sectional view of power transmission device 41. FIG. 18 is a sectional view of power transmission device 41. As shown in FIGS. 17 and 18, power transmission device 41 includes a housing case 150, a support member 151 housed within housing case 150, and an anchor member 152 housed within housing case 150.

Power transmission unit 28 and impedance adjuster 29 are housed inside housing case 150. Housing case 150 includes a shield 153 having an opening formed, and a lid 154 formed so as to close the opening.

Shield 153 includes a bottom plate 155, and a peripheral wall 156 formed erecting from the circumferential edge of bottom plate 155 upwards. The opening is formed at a position opposite to bottom plate 155.

Shield 153 is formed of a metal material such as copper. Lid 154 is formed of, for example, insulative resin material.

The electromagnetic field (magnetic field) developed around coil 24 can pass through lid 154. The electromagnetic field (magnetic field) developed around coil 24 is emitted outwards through the opening of shield 153. Thus, shield 153 defines the formation region of an electromagnetic field developed around coil 24.

Support member 151 is formed in a tubular shape in the example of FIGS. 17 and 18. Coil 24 and coil 23 are attached to the outer circumferential face of support member 151. In support member 151 are arranged impedance adjuster 29, capacitor 25, and anchor member 152. The shape of support member 151 is not limited to a tubular insulation member. For example, a plurality of rod-like supports aligned annularly may constitute support member 151.

Impedance adjuster 29 is secured to bottom plate 155. Capacitor 25 is anchored to lid 154 by anchor member 152.

Capacitor 25 is connected to coil 24 through a wiring 159. Impedance adjuster 29 is connected to coil 23 through a wiring 160.

As shown in FIG. 18, capacitor 25 is arranged spaced apart from shield 153. Therefore, even if high voltage is applied to capacitor 25 in electric power transfer, the flow of a current between capacitor 25 and shield 153 can be suppressed.

Particularly, since capacitor 25 is secured by anchor member 152 in the present embodiment, the separated state between capacitor 25 and shield 153 can be ensured even if power transmission device 41 is inclined or external force is applied to power transmission device 41.

Moreover, since capacitor 25 is arranged at lid 154 formed of an insulative material, the flow of a current between capacitor 25 and shield 153 can be suppressed.

Figure 19:
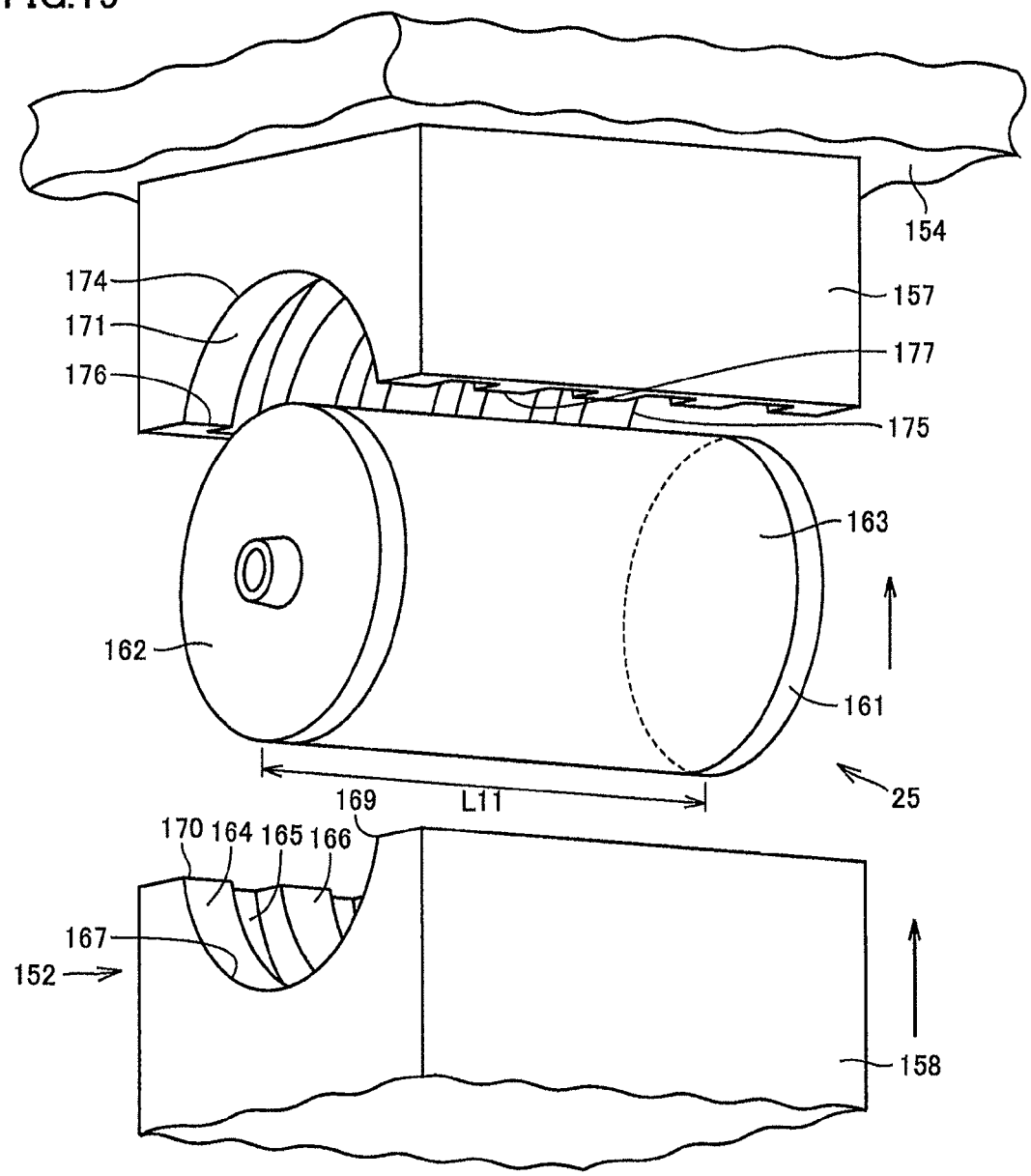
FIG. 19 is an exploded perspective view of a capacitor and anchor member.

FIG. 19 is an exploded perspective view representing capacitor 25 and anchor member 152. As shown in FIGS. 19 and 18, capacitor 25 includes an electrode plate 161, an electrode plate 162 provided opposite to electrode plate 161 with a distance therebetween, and a dielectric 163 arranged between electrode plate 161 and electrode plate 162. The distance between electrode plate 161 and electrode plate 162 is L11.

In electric power transfer, a large voltage is applied across electrode plate 161 and electrode plate 162. Distance L11 between electrode plate 161 and electrode plate 162 is ensured such that, when a large voltage is applied across electrode plate 161 and electrode plate 162, discharging does not occur between electrode plate 161 and electrode plate 162.

In FIG. 18, a distance L12 that is the distance between capacitor 25 and shield 153 is greater than distance L11.

Since capacitor 25 and shield 153 are arranged spaced apart from each other, the flow of a current between capacitor 25 and shield 153 is suppressed.

Moreover, since capacitor 25 is arranged at lid 154 formed of an insulative material, the flow of current between capacitor 25 and lid 154 may be suppressed. Thus, the distance of insulation is ensured between capacitor 25 and shield 153.

Capacitor 25 is arranged in a support member 151. Distance L12 is greater than distance L13 that is the distance between coil 24 and shield 153. Therefore, the distance between capacitor 25 and shield 153 is long, allowing the flow of a current between capacitor 25 and shield 153 to be suppressed.

In FIG. 18, distance L12 is greater than distance L14 that is the distance between impedance adjuster 29 and capacitor 25. Distance L14 is greater than distance L11, suppressing the flow of a current between impedance adjuster 29 and capacitor 25.

Thus, by setting distance L12 greater than distance L14 that ensures the distance of insulation, the flow of a current between capacitor 25 and shield 153 can be suppressed.

Figure 20:
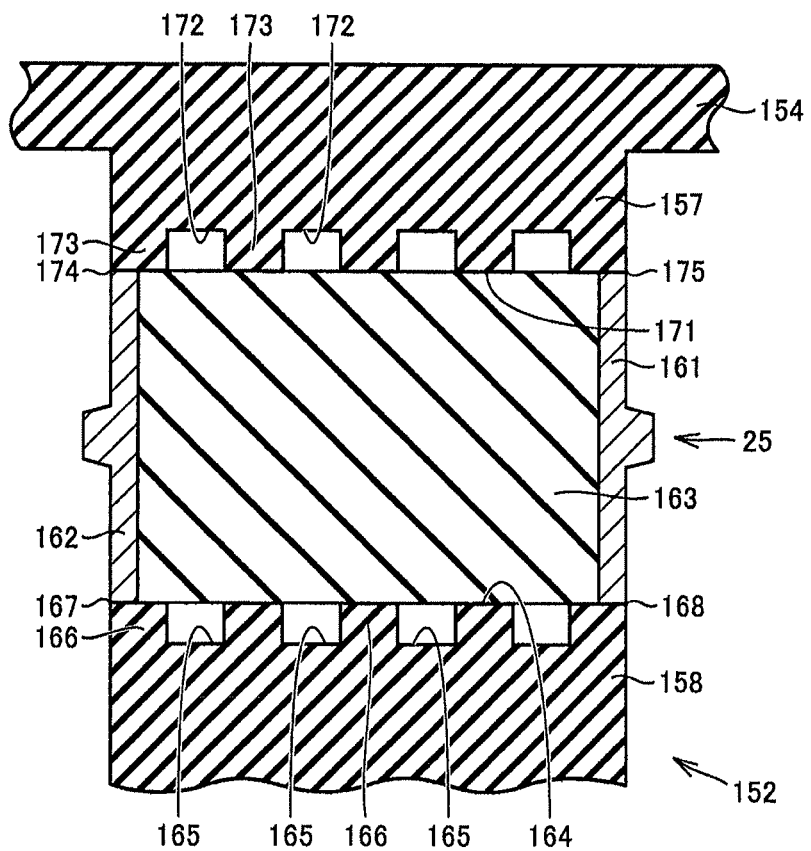
FIG. 20 is a sectional view representing the anchor member and capacitor.

FIG. 20 is a sectional view of anchor member 152 and capacitor 25. Anchor member 152 includes an anchorage 158 having the lower end secured to bottom plate 155 shown in FIG. 17, and a support 157 formed at lid 154. Both anchorage 158 and support 157 are formed of an insulative material, for example, insulative resin.

At the upper end of anchorage 158, a contact face 164 in contact with capacitor 25 is formed. In the present embodiment, capacitor 25 is formed in a columnar shape. Contact face 164 is formed to curve in a circular form along the circumferential face of capacitor 25.

The edge region of contact face 164 includes a curving section 167 bending along the circumferential face of capacitor 25, a curving section 168 formed spaced apart from curving section 167, and side sections 169 and 170 shown in FIG. 19, formed to connect curving sections 167 and 168.

The region of contact face 164 located between electrode plate 161 and electrode plate 162 has a plurality of trenches 165 formed spaced apart.

Trenches 165 are formed spaced apart in the direction from electrode plate 162 to electrode plate 161. Contact section 166 is formed at a position adjacent to trench 165.

In the examples shown in FIGS. 19 and 20, trench 165 is formed extending from side section 170 to side section 169. Contact section 166 is formed extending from side section 170 to side section 169. A plurality of contact sections 166 are in contact with capacitor 25.

Therefore, at contact face 164 of anchor 158, the creepage distance between electrode plate 162 and electrode plate 161 is long, suppressing the occurrence of discharging between electrode plate 162 and electrode plate 161.

For the shape of trench 165, various types of forms may be employed. For example, a plurality of trenches may be arranged in a staggered manner to increase the creepage distance between electrode plate 162 and electrode plate 161.

Support 157 is formed so as to project downwards from the lower face of lid 154. At the lower face of support 157, a support face 171 supporting the circumferential face of capacitor 25 is formed. Capacitor 25 is secured by being sandwiched between support face 171 and contact face 164.

The edge region of support face 171 includes a curving section 174 bending along the circumferential face of capacitor 25, a curving section 175 arranged spaced apart from curving section 174, and side sections 176 and 177 connecting curving section 174 and curving section 175.

At support face 171, a plurality of trenches 172 are formed spaced apart in the direction from electrode plate 162 towards electrode plate 161. A contact section 173 is formed at the region adjacent to trench 172. Contact section 173 is in contact with the circumferential face of capacitor 25.

Therefore, support 157 is similarly formed such that the creepage distance between electrode plate 161 and electrode plate 162 becomes longer, suppressing the occurrence of discharging between electrode plate 161 and electrode plate 162.

Although support face 171 is formed at the top face of support 157 in the present embodiment, support face 171 may be formed directly at the top face of lid 154. For the shape of trench 172, various types of forms may be employed.

Figure 21:
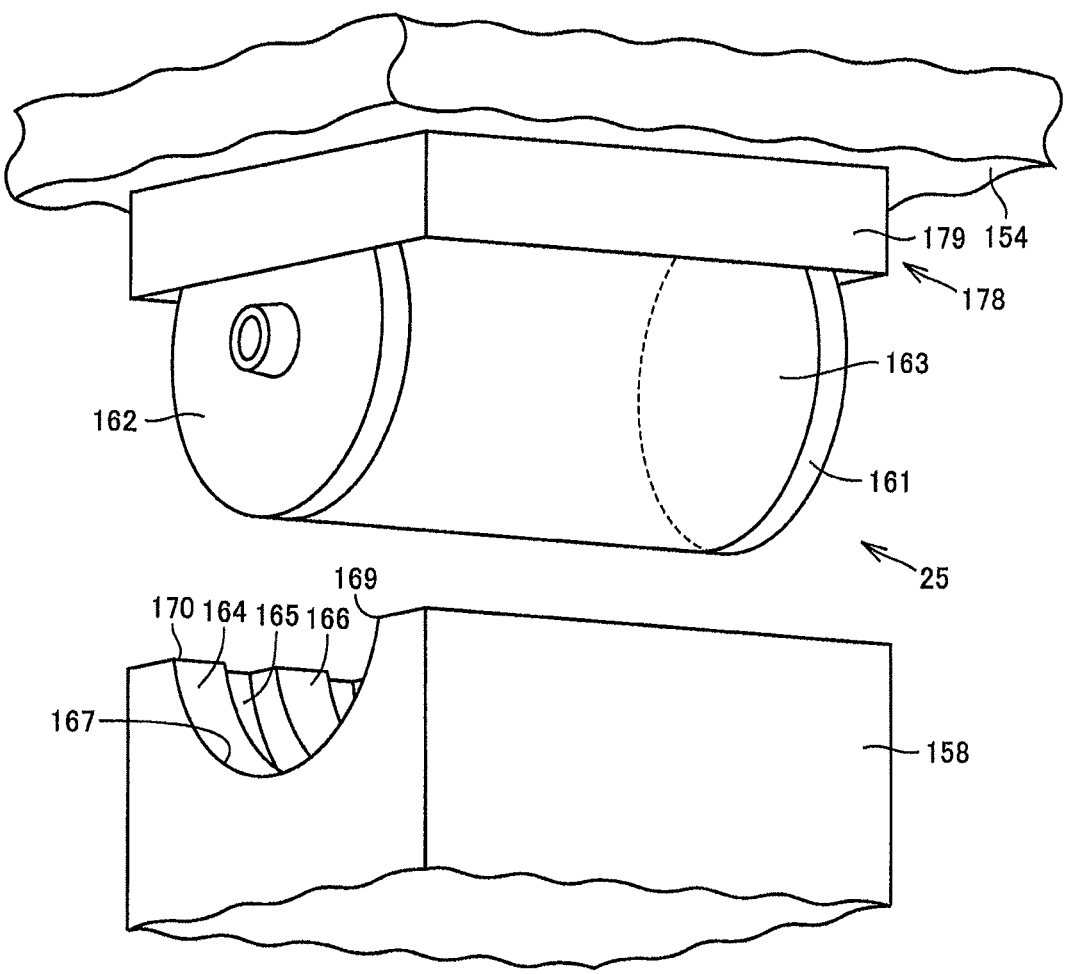
FIG. 21 is a perspective view representing a first modification example of the anchor member.

FIG. 21 is a perspective view representing a first modification example of anchor member 152. In the example of FIG. 21, anchor member 152 includes an anchorage 158 supporting capacitor 25 from the lower side, and a support member 178 formed on the lower face of lid 154, and supporting capacitor 25.

Support member 178 includes a plurality of support walls 179 arranged annularly. Capacitor 25 is supported by support member 178.

In the example shown in FIG. 21, capacitor 25 is secured by anchorage 158 pressing capacitor 25 from the bottom and support member 178 supporting the upper side of capacitor 25. Accordingly, the rolling of capacitor 25 can be suppressed even when power transmission device 41 is inclined.

Figure 22:
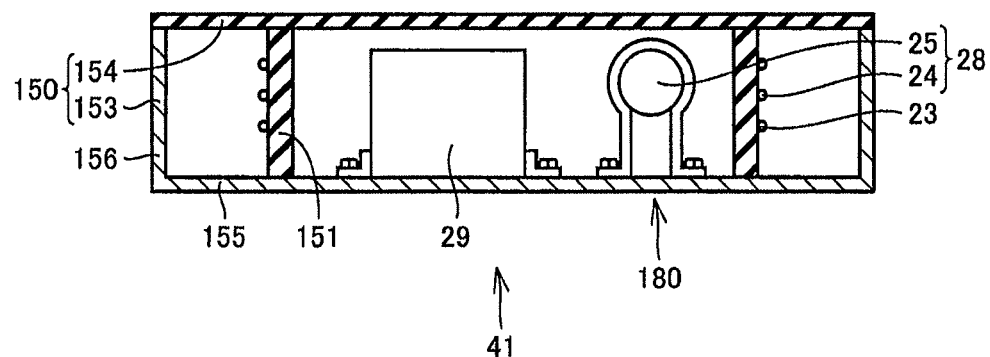
FIG. 22 is a sectional view of a power transmission device representing a second modification example of the anchor member.

FIG. 22 is a sectional view of power transmission device 41 representing a second modification example of the anchor member. In the example shown in FIG. 22, capacitor 25 is secured by anchor member 180. Anchor member 180 is secured to bottom plate 155.

Figure 23:
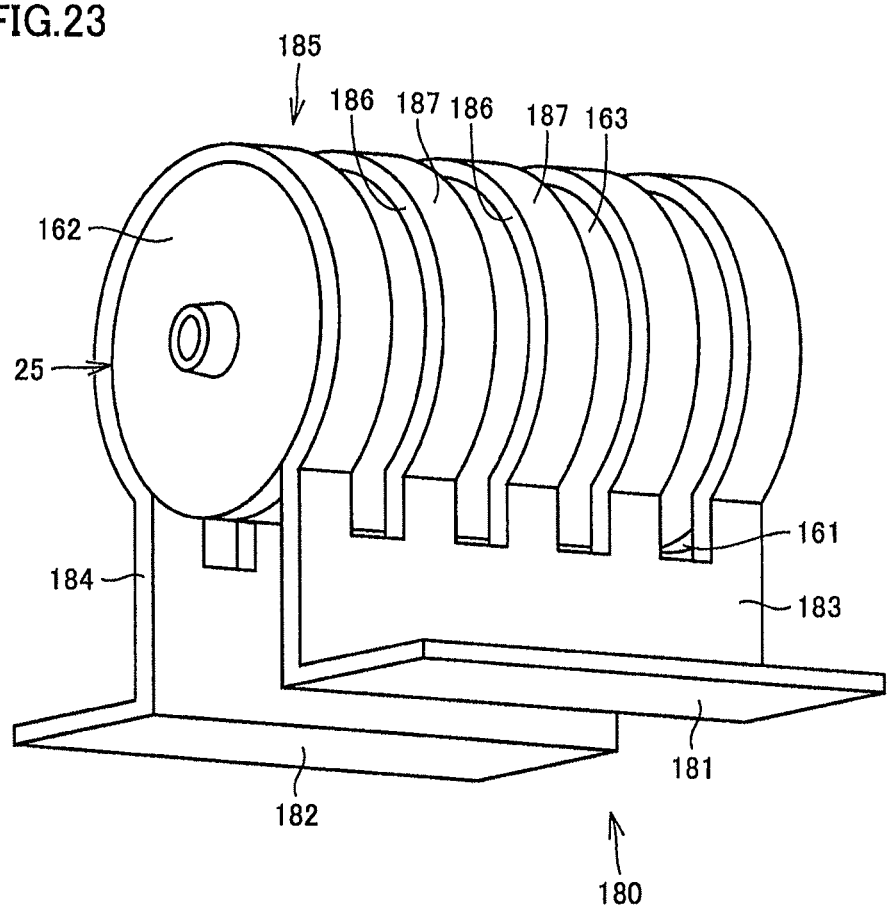
FIG. 23 is a perspective view of the anchor member.

FIG. 23 is a perspective view of anchor member 180. As shown in FIG. 23, anchor member 180 includes anchorages 181 and 182 secured to bottom plate 155 of FIG. 22, legs 183 and 184 formed to erect upwards from anchorages 181 and 182, and a holder 185 holding capacitor 25, formed so as to cover the circumferential face of capacitor 25.

The region of holder 185 located between electrode plate 161 and electrode plate 162 had a plurality of holes 186 formed. Holes 186 are formed spaced apart in the direction from electrode plate 162 towards electrode plate 161. A plurality of contact sections 187 are formed at the regions between adjacent holes 186, in contact with and supporting capacitor 25.

Figure 24:
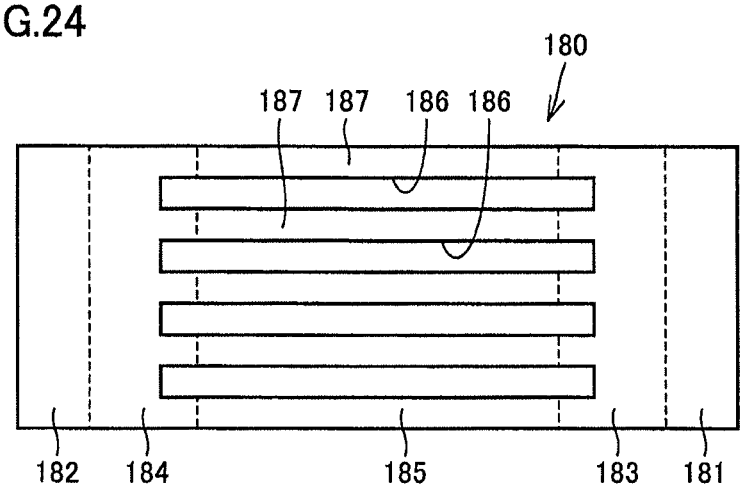
FIG. 24 is a development view of the anchor member shown in FIG. 23.

FIG. 24 is a development view of anchor member 180 shown in FIG. 23. Referring to FIG. 24, hole 186 is formed so as to arrive at leg 184 from leg 183.

Therefore, even when capacitor 25 is secured by anchor member 180 shown in FIGS. 24 and 23, the creepage distance between electrode plate 161 and electrode plate 162 is long, allowing the occurrence of discharging between electrode plate 161 and electrode plate 162 to be suppressed.

Figure 25:
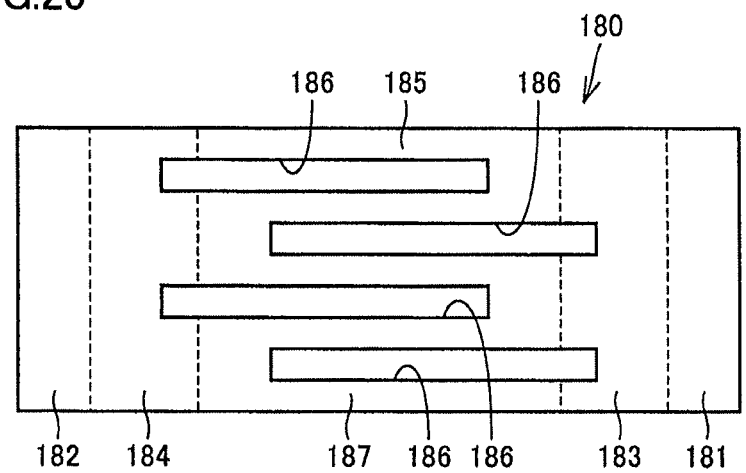
FIG. 25 is a development view representing a first modification example of the anchor member shown in FIG. 23.

FIG. 25 is a development view representing a first modification example of anchor member 180. In the example of FIG. 25, a plurality of holes 186 are formed in a staggered manner. In the example shown in FIG. 25, the creepage distance between electrode plate 161 and electrode plate 162 can be increased.

Figure 26:
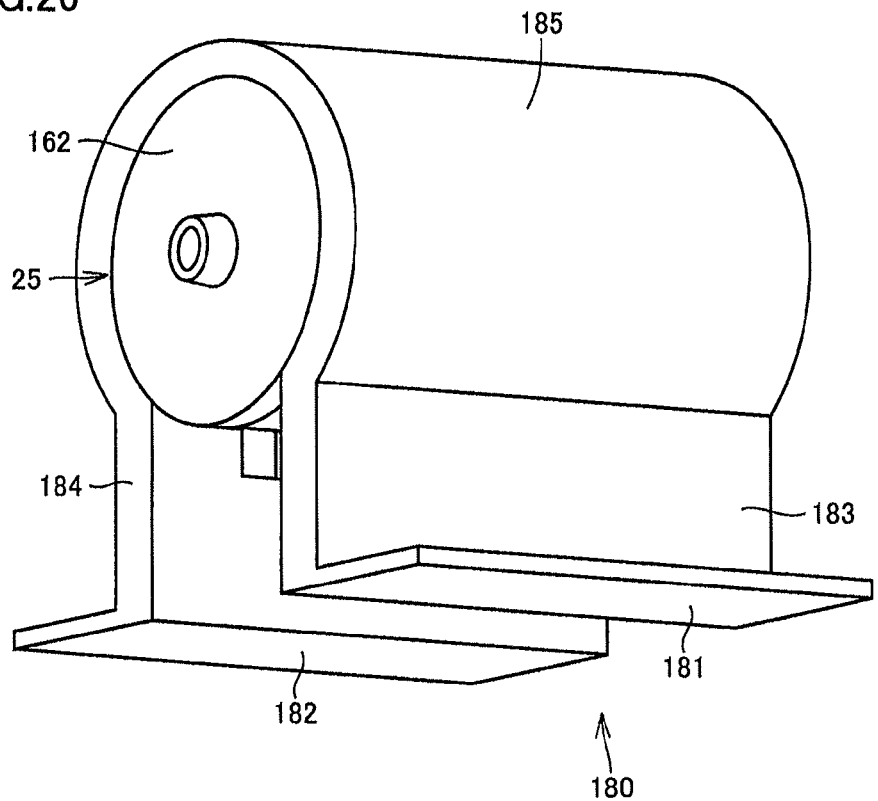
FIG. 26 is a perspective view representing a second modification example of the anchor member shown in FIG. 23.

FIG. 26 is a perspective view representing a second modification example of anchor member 180. As shown in FIG. 26, anchor member 180 includes anchorages 181 and 182, legs 183 and 184 formed erecting upwards from anchorages 181 and 182, and a holder 185 connected to the upper ends of legs 183 and 184, holding capacitor 25.

Figure 27:
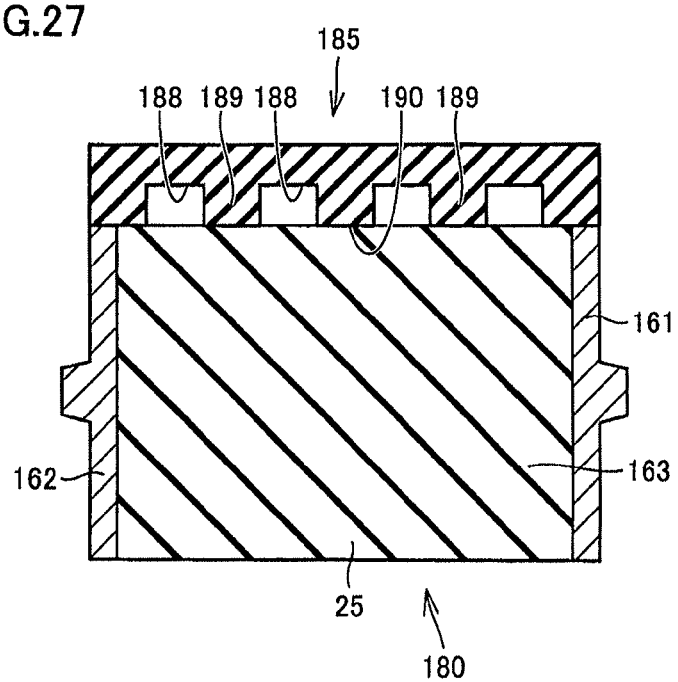
FIG. 27 is a sectional view of the anchor member shown in FIG. 26.

FIG. 27 is a sectional view of anchor member 180 shown in FIG. 26. In FIG. 27, an inner circumferential face 190 of holder 185 has a plurality of trenches 188 formed, spaced apart in the direction from electrode plate 161 towards electrode plate 162. A contact section 189 is formed at the region adjacent to trench 188.

Trench 188 is formed extending from leg 183 to leg 184 shown in FIG. 26. A plurality of contact sections 189 support the circumferential face of capacitor 25. In the examples shown in FIGS. 26 and 27, the creepage distance between electrode plate 161 and electrode plate 162 is long, suppressing the occurrence of discharging between electrode plate 161 and electrode plate 162.

Although capacitor 19 is arranged at the inner circumferential side of support member 51 in the present embodiment, capacitor 19 may be arranged at the outer circumferential side of support member 151 as long as the distance between capacitor 19 and shield 153 is ensured. Similarly, although capacitor 25 is arranged at the inner circumferential side of support member 151, capacitor 25 may be arranged at the outer circumferential side of support member 151 as long as the distance between capacitor 25 and shield 153 is ensured.

It should be understood that the embodiments disclosed herein are illustrative and non-restrictive in every respect. The scope of the present invention is defined by the terms of the claims, rather than the description of the embodiments set forth above, and is intended to include any modifications within the scope and meaning equivalent to the terms of the claims.

INDUSTRIAL APPLICABILITY

The present invention can be applied to a power reception device, a power transmission device, and a power transfer system.

REFERENCE SIGNS LIST 10 electric power vehicle; 11, 12, 23, 24 coil; 13 rectifier; 14 converter; 15 battery; 16 power control unit; 17 monitor unit; 19, 25, 295, 298 capacitor; 20 external power feeding device; 21 AC power source; 22 high frequency electric power driver; 26 control unit; 27, 296 power reception unit; 28, 293 power transmission unit; 29 impedance adjuster; 40, 291 power reception device; 41, 290 power transmission device; 42 parking space; 50, 150 housing case; 51, 78, 151, 178 support member; 52, 80, 152, 180 anchor member; 53, 153 shield; 54, 154 lid; 55 top plate; 56, 156 peripheral wall; 57, 157 support; 58, 81, 82, 158, 181, 182 anchorage; 59, 60, 159, 160 wiring; 61, 62, 161, 162 electrode plate; 63, 163 dielectric; 64, 164 contact face; 65, 72, 88, 165, 172, 188 trench; 66, 73, 87, 89, 166, 173, 187, 189 contact section; 67, 68, 74, 75, 167, 168, 174, 175 curving section; 71, 171 support face; 79, 179 support wall; 83, 84, 183, 184 leg; 85, 185 holder; 86, 186 hole; 90, 190 inner circumferential face; 155 bottom plate; 292, 297 electromagnetic induction coil; 294, 299 resonant coil; 300 power transfer system.

The invention claimed is:

1. A power reception device comprising:
a power reception unit including a first capacitor, and receiving electric power in a non-contact manner from an externally provided power transmission unit,
a first housing case housing said power reception unit inside, and
a first anchor member anchoring said first capacitor,
said first housing case including a first shield defining a region where an electromagnetic field developed around said power reception unit is emitted,
said first capacitor being anchored by said first anchor member at a position spaced apart from said first shield, said first shield including:
a top plate; and
a first peripheral wall formed suspending from said top plate,
said first shield having a first opening formed, opposite to said top plate,
said first housing case including an insulative first lid closing said first opening, and
said first capacitor being secured to said first lid.

2. The power reception device according to claim 1, wherein
said first capacitor includes:
a first electrode; and
a second electrode arranged opposite to said first electrode with a distance therebetween, and a distance between said first capacitor and said first shield is greater than a distance between said first electrode and said second electrode.

3. The power reception device according to claim 1, wherein
said power reception unit includes:
a first wiring connected to said first capacitor; and
a first coil connected to said first capacitor by said first wiring, and
a distance between said first shield and said first capacitor is greater than a distance between said first coil and said first capacitor.

4. The power reception device according to claim 1, further comprising:
a first device arranged inside said first housing case, and provided spaced apart from said first capacitor,
wherein a distance between said first shield and said first capacitor is greater than a distance between said first device and said first capacitor.

5. The power reception device according to claim 1, wherein a difference between a natural frequency of said power transmission unit and a natural frequency of said power reception unit is less than or equal to 10% the natural frequency of said power reception unit.

6. The power reception device according to claim 1, wherein a coupling coefficient between said power reception unit and said power transmission unit is less than or equal to 0.1.

7. The power reception device according to claim 1, wherein said power reception unit receives electric power from said power transmission unit through at least one of a magnetic field developed between said power reception unit and said power transmission unit, and oscillating at a particular frequency, and an electric field developed between said power reception unit and said power transmission unit, and oscillating at a particular frequency.

8. A power reception device comprising:
a power reception unit including a first capacitor, and receiving electric power in a non-contact manner from an externally provided power transmission unit,
a first housing case housing said power reception unit inside, and
a first anchor member anchoring said first capacitor,
said first housing case including a first shield defining a region where an electromagnetic field developed around said power reception unit is emitted,
said first capacitor being anchored by said first anchor member at a position spaced apart from said first shield,
said first capacitor including:
a first electrode; and
a second electrode arranged opposite to said first electrode with a distance therebetween,
said first anchor member including a first contact face in contact with said first capacitor, and
a region of said first contact face, located between said first electrode and said second electrode, having a trench formed.

9. A power reception device comprising:
a power reception unit including a first capacitor, and receiving electric power in a non-contact manner from an externally provided power transmission unit,
a first housing case housing said power reception unit inside, and
a first anchor member anchoring said first capacitor,
said first housing case including a first shield defining a region where an electromagnetic field developed around said power reception unit is emitted,
said first capacitor being anchored by said first anchor member at a position spaced apart from said first shield,
said first shield including:
a top plate; and
a first peripheral wall formed suspending from said top plate,
said first shield having a first opening formed, opposite to said top plate,
said first housing case including:
an insulative first lid closing said first opening; and
a first support provided at said first lid, supporting said first capacitor,
said first capacitor including:
a first electrode; and
a second electrode arranged opposite to said first electrode with a distance therebetween,
a region of an inner circumferential face of said first support, located between said first electrode and said second electrode, having a trench formed.

10. A power reception device comprising:
a power reception unit including a first capacitor, and receiving electric power in a non-contact manner from an externally provided power transmission unit,
a first housing case housing said power reception unit inside, and
a first anchor member anchoring said first capacitor,
said first housing case including a first shield defining a region where an electromagnetic field developed around said power reception unit is emitted,
said first capacitor being anchored by said first anchor member at a position spaced apart from said first shield,
said first capacitor including:
a first electrode; and
a second electrode arranged opposite to said first electrode with a distance therebetween,
said first anchor member including a first holder formed so as to cover a circumferential face of said first capacitor, and
a region of an inner circumferential face of said first holder, located between said first electrode and said second electrode, having a trench formed.

11. A power reception device comprising:
a power reception unit including a first capacitor, and receiving electric power in a non-contact manner from an externally provided power transmission unit,
a first housing case housing said power reception unit inside, and
a first anchor member anchoring said first capacitor,
said first housing case including a first shield defining a region where an electromagnetic field developed around said power reception unit is emitted,
said first capacitor being anchored by said first anchor member at a position spaced apart from said first shield,
said first capacitor including:
a first electrode; and
a second electrode arranged opposite to said first electrode with a distance therebetween,
said first anchor member including a second holder formed so as to cover an inner circumferential face of said first capacitor, and
a region of an inner circumferential face of said second holder, located between said first electrode and said second electrode, having a hole formed.

12. A power transmission device comprising:
a power transmission unit including a second capacitor, and transmitting electric power in a non-contact manner to an externally provided power reception unit, a second housing case housing said power transmission unit inside, and
a second anchor member anchoring said second capacitor,
said second housing case including a second shield defining a region where an electromagnetic field developed around said power transmission unit is emitted,
said second capacitor being anchored by said second anchor member at a position spaced apart from said second shield,
said second shield including:
a bottom plate; and
a second peripheral wall formed so as to erect from said bottom plate,
said second shield having a second opening formed, opposite to said bottom plate,
said second housing case including an insulative second lid closing said second opening, and
said second capacitor being secured to said second lid.

13. The power transmission device according to claim 12, wherein
said second capacitor includes:
a third electrode; and
a fourth electrode arranged opposite to said third electrode with a distance therebetween, and
a distance between said second capacitor and said second shield is greater than a distance between said third electrode and said fourth electrode.

14. The power transmission device according to claim 12, wherein
said power transmission unit includes:
a second wiring connected to said second capacitor; and
a second coil connected to said second capacitor by said second wiring, and
a distance between said second shield and said second capacitor is greater than a distance between said second coil and said second capacitor.

15. The power transmission device according to claim 12, further comprising:
a second device arranged in said second housing case and provided spaced apart from said second capacitor,
wherein a distance between said second shield and said second capacitor is greater than a distance between said second device and said second capacitor.

16. The power transmission device according to claim 12, wherein a difference between a natural frequency of said power transmission unit and a natural frequency of said power reception unit is less than or equal to 10% the natural frequency of said power reception unit.

17. The power transmission device according to claim 12, wherein a coupling coefficient between said power transmission unit and said power reception unit is less than or equal to 0.1.

18. The power transmission device according to claim 12, wherein said power transmission unit transmits electric power to said power reception unit through at least one of a magnetic field developed between said power reception unit and said power transmission unit, and oscillating at a particular frequency, and an electric field developed between said power reception unit and said power transmission unit, and oscillating at a particular frequency.

19. A power transmission device comprising:
a power transmission unit including a second capacitor, and transmitting electric power in a non-contact manner to an externally provided power reception unit,
a second housing case housing said power transmission unit inside, and
a second anchor member anchoring said second capacitor,
said second housing case including a second shield defining a region where an electromagnetic field developed around said power transmission unit is emitted,
said second capacitor being anchored by said second anchor member at a position spaced apart from said second shield,
said second capacitor including:
a third electrode; and
a fourth electrode arranged opposite to said third electrode with a distance therebetween,
said second anchor member including a second contact face in contact with said second capacitor, and
a region of said second contact face, located between said third electrode and said fourth electrode, having a trench formed.

20. A power transmission device comprising:
a power transmission unit including a second capacitor, and transmitting electric power in a non-contact manner to an externally provided power reception unit,
a second housing case housing said power transmission unit inside, and
a second anchor member anchoring said second capacitor,
said second housing case including a second shield defining a region where an electromagnetic field developed around said power transmission unit is emitted,
said second capacitor being anchored by said second anchor member at a position spaced apart from said second shield,
said second shield including:
a bottom plate; and
a second peripheral wall formed so as to erect from said bottom plate,
said second shield having a second opening formed, opposite to said bottom plate,
said second housing case including:
an insulative second lid closing said second opening; and
a second support provided at said second lid, and supporting said second capacitor,
said second capacitor including:
a third electrode; and
a fourth electrode arranged opposite to said third electrode with a distance therebetween, and
a region of an inner circumferential face of said second support, located between said third electrode and said fourth electrode, having a trench formed.

21. A power transmission device comprising:
a power transmission unit including a second capacitor, and transmitting electric power in a non-contact manner to an externally provided power reception unit,
a second housing case housing said power transmission unit inside, and
a second anchor member anchoring said second capacitor,
said second housing case including a second shield defining a region where an electromagnetic field developed around said power transmission unit is emitted,
said second capacitor being anchored by said second anchor member at a position spaced apart from said second shield,
said second capacitor including:
a third electrode; and
a fourth electrode arranged opposite to said third electrode with a distance therebetween,
said second anchor member including a third holder formed so as to cover a circumferential face of second capacitor, and a region of an inner circumferential face of said third holder, located between said third electrode and said fourth electrode, having a trench formed.

22. A power transmission device comprising:
a power transmission unit including a second capacitor, and transmitting electric power in a non-contact manner to an externally provided power reception unit,
a second housing case housing said power transmission unit inside, and
a second anchor member anchoring said second capacitor,
said second housing case including a second shield defining a region where an electromagnetic field developed around said power transmission unit is emitted,
said second capacitor being anchored by said second anchor member at a position spaced apart from said second shield,
said second capacitor including:
  a third electrode; and
  a fourth electrode arranged opposite to said third electrode with a distance therebetween,
said second anchor member including a fourth holder formed so as to cover a circumferential face of said second capacitor, and
a region of an inner circumferential face of said fourth holder, located between said third electrode and said fourth electrode, having a hole formed.

23. A power transfer system comprising:
a power transmission device including a power transmission unit; and
a power reception device,
said power reception device including:
  a power reception unit receiving electric power from said power transmission unit in a non-contact manner, and including a first capacitor;
  a first housing case housing said power reception unit inside; and
  a first anchor member anchoring said first capacitor,
said first housing case including a first shield defining a region where an electromagnetic field developed around said power reception unit is emitted,
said first capacitor being anchored by said first anchor member at a position spaced apart from said first shield,
said first shield including:
  a top plate; and
  a first peripheral wall formed suspending from said top plate,
said first shield having a first opening formed, opposite to said top plate,
said first housing case including an insulative first lid closing said first opening, and
said first capacitor being secured to said first lid.

24. A power transfer system comprising:
a power reception device including a power reception unit; and
a power transmission device,
said power transmission device including:
  a power transmission unit transmitting electric power in a non-contact manner to said power reception unit, and including a second capacitor;
  a second housing case housing said power transmission unit inside; and
  a second anchor member anchoring said second capacitor,
said second housing case including a second shield defining a region where an electromagnetic field developed around said power transmission unit is emitted,
said second capacitor being anchored by said second anchor member at a position spaced apart from said second shield,
said second shield including:
  a bottom plate; and
  a second peripheral wall formed so as to erect front said bottom plate,
said second shield having a second opening formed, opposite to said bottom plate,
said second housing case including an insulative second lid closing said second opening, and
said second capacitor being secured to said second lid.

* * * * *